United States Patent
Kikuchi et al.

(10) Patent No.: US 8,710,639 B2
(45) Date of Patent: Apr. 29, 2014

(54) SEMICONDUCTOR ELEMENT-EMBEDDED WIRING SUBSTRATE

(75) Inventors: Katsumi Kikuchi, Minato-ku (JP); Shintaro Yamamichi, Minato-ku (JP); Hideya Murai, Minato-ku (JP); Kentaro Mori, Minato-ku (JP); Yoshiki Nakashima, Minato-ku (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 13/639,735

(22) PCT Filed: Feb. 22, 2011

(86) PCT No.: PCT/JP2011/053828
§ 371 (c)(1),
(2), (4) Date: Oct. 5, 2012

(87) PCT Pub. No.: WO2011/125380
PCT Pub. Date: Oct. 13, 2011

(65) Prior Publication Data
US 2013/0026632 A1   Jan. 31, 2013

(30) Foreign Application Priority Data
Apr. 8, 2010   (JP) .................................. 2010-089594

(51) Int. Cl.
*H01L 23/02*   (2006.01)
(52) U.S. Cl.
USPC ........... 257/679; 257/753; 257/774; 257/777; 257/E23.01
(58) Field of Classification Search
USPC ......... 257/678–679, 750, 768, 774, 777–779, 257/782, 753
See application file for complete search history.

(56) References Cited

U.S. PATENT DOCUMENTS 6,864,165 B1 *  3/2005  Pogge et al. .................. 438/612
8,466,544 B2 *  6/2013  Pagaila ......................... 257/686
(Continued)

FOREIGN PATENT DOCUMENTS

JP   2001-339165 A   12/2001
(Continued)

OTHER PUBLICATIONS

International Search Report for PCT/JP2011/053828 dated May 31, 2011.

*Primary Examiner* — Dung A. Le
(74) *Attorney, Agent, or Firm* — Sughrue Mion, PLLC

(57) ABSTRACT

A wiring substrate in which a semiconductor element is built includes a semiconductor element; a peripheral insulating layer covering at least an outer circumferential side surface of this semiconductor element; and an upper surface-side wiring line provided on the upper surface side of the wiring substrate. The semiconductor element includes an internal terminal electrically connected to the upper surface-side wiring line on the upper surface side of the semiconductor element. This internal terminal includes a first conductive part exposed out of an insulating surface layer of the semiconductor element; an adhesion layer on this first conductive part; and a second conductive part on this adhesion layer. The adhesion layer covers an exposed surface of the first conductive part, and is formed on a portion of the insulating surface layer around the exposed surface of the first conductive part, and the adhesion layer extends around the outer side of an outer edge of this second conductive part so as to surround the second conductive part.

21 Claims, 9 Drawing Sheets

(56) References Cited

U.S. PATENT DOCUMENTS

| | | |
|---|---|---|
| 2003/0025184 A1 | 2/2003 | Morozumi |
| 2005/0263907 A1 | 12/2005 | Yamano |
| 2008/0079157 A1 | 4/2008 | Kurita et al. |

FOREIGN PATENT DOCUMENTS

| | | |
|---|---|---|
| JP | 2003-51569 A | 2/2003 |
| JP | 2004-95836 A | 3/2004 |
| JP | 2005-340655 A | 12/2005 |
| JP | 2006-32600 A | 2/2006 |
| JP | 2007-150154 A | 6/2007 |
| JP | 2008-91640 A | 4/2008 |
| JP | 2008-182039 A | 8/2008 |
| JP | 2008-288607 A | 11/2008 |
| JP | 2009-71045 A | 4/2009 |
| WO | 2008/120755 A1 | 10/2008 |

* cited by examiner (a)

(b)

(c)

(d)

SEMICONDUCTOR ELEMENT-EMBEDDED WIRING SUBSTRATE

CROSS REFERENCE TO RELATED APPLICATIONS

This application is a National Stage of International Application No. PCT/JP2011/053828 filed Feb. 22, 2011, claiming priority based on Japanese Patent Application No. 2010-089594 filed Apr. 8, 2010, the contents of all of which are incorporated herein by reference in their entirety.

TECHNICAL FIELD

The present invention relates to a wiring substrate in which a semiconductor element is embedded.

BACKGROUND ART

As electronic equipment is reduced in weight, thickness and size, high-density packaging technology in semiconductor packages is developing along with the downsizing and high integration of semiconductor elements.

In the packaging of a semiconductor element, such as an IC chip, a connection between a wiring substrate and the semiconductor element within a package is made by means of wire bonding connection using a gold wire or the like or flip-chip connection using a solder ball or the like.

Wire bonding connection has the advantage of being capable of packaging at low cost if the number of connecting pads of the semiconductor element is small. A wire diameter has to be made smaller, however, with an increase in the number of connecting pads and a decrease in pitch. Accordingly, wire bonding connection has the problem that a yield degrades due to assembly failure, such as wire breakage. In addition, wire bonding connection requires a certain distance to be secured in a connection path between a terminal of the semiconductor element and the wiring substrate. Thus, wire bonding connection is liable to cause degradation in high-speed transmission characteristics.

Flip-chip connection enables high-speed signal transmission, since a connection path between the semiconductor element and the wiring substrate is shorter, compared with a connection path in wire bonding connection. In addition, it is possible to increase the number of connecting terminals since terminals can be provided not only in the periphery of a circuit-formed surface of the semiconductor element but also across the entire range thereof. As the number of connecting pads of the semiconductor element increases and a pitch between connecting pads becomes narrower, however, connection strength decreases with a decrease in the size of a solder bump. Accordingly, flip-chip connection has the problem of being liable to cause connection failure, such as cracks.

In recent years, packaging technology for embedding a semiconductor element in a wiring substrate, i.e., so-called semiconductor element-embedding technology has been proposed as high-density packaging technology for facilitating the further densification and functional upgrading of a semiconductor device.

For example, Patent Literature 1 describes a multilayer printed-wiring substrate in which interlayer insulating films and conductor layers are repetitively formed on the substrate including electronic components built therein, and the electronic components are electrically connected to the conductor layers through vias formed in the interlayer insulating films. In this multilayer printed-wiring substrate, a transition layer for connection with a via of the lowermost interlayer insulating film is formed on an upper portion of each die pad of the electronic components. The patent literature describes that this configuration improves the connectivity of the pad and the via and the reliability of connection therebetween.

Patent Literature 2 discloses a semiconductor device provided with a semiconductor structure (CSP: chip size package) including a semiconductor chip, a rewiring line on this semiconductor chip, a sealing film covering this rewiring line, and a columnar electrode on this rewiring line; a frame-shaped embedding material provided laterally to this semiconductor structure; a sealing film provided between this semiconductor structure and this frame-shaped embedding material; an insulating film covering this semiconductor structure; and an upper layer-side rewiring line provided on this insulating film and connected to the columnar electrode, wherein the semiconductor structure and the frame-shaped embedding material are provided on a base plate.

Patent Literature 3 discloses a semiconductor device in which a plurality of chips is stacked and built in a wiring substrate, and an external terminal is provided on the rear surface side of this wiring substrate.

Patent Literature 4 discloses a multilayer wiring substrate provided with an antenna section in which a plurality of insulated substrates including antenna-composing patterns formed therein is stacked with an intervention of adhesive layers and the antenna-composing patterns are connected to one another by way of feedthrough electrodes, thereby forming an antenna coil; and an electronic component connected to the antenna coil of this antenna section by way of feedthrough electrodes and buried in the adhesive layers.

CITATION LIST

Patent Literature

Patent Literature 1: JP2001-339165A
Patent Literature 2: JP2004-95836A
Patent Literature 3: JP2007-150154A
Patent Literature 4: JP2008-182039A

SUMMARY OF INVENTION

Technical Problem

In a wiring substrate including a semiconductor element built therein, there is a large difference in thermal expansion coefficient between the constituent material of the semiconductor element and a resin material of the wiring substrate. Accordingly, stress applied to an electrical connecting part between the semiconductor element and the wiring substrate is large. Thus, the wiring substrate has the problem that this connecting part is liable to breakage.

An object of the present invention is to provide a thin high-reliability wiring substrate including a high-density semiconductor element built therein.

Solution to Problem

According to one aspect of the present invention, there is provided a wiring substrate in which a semiconductor element is built, the wiring substrate including:

the semiconductor element;

a peripheral insulating layer covering at least an outer circumferential side surface of the semiconductor element; and an upper surface-side wiring line provided on the upper surface side of the wiring substrate, the semiconductor element including, on the upper surface side thereof, an internal terminal electrically connected to the upper surface-side wiring line, the internal terminal including:

a first conductive part exposed out of an insulating surface layer of the semiconductor element;

an adhesion layer on the first conductive part; and a second conductive part on the adhesion layer, the adhesion layer being provided on a portion of the insulating surface layer around an exposed surface of the first conductive part, so as to cover the exposed surface, and extending around the outer side of an outer edge of the second conductive part, so as to surround the second conductive part.

Advantageous Effect of Invention

According to the present invention, it is possible to provide a thin high-reliability wiring substrate including a high-density semiconductor element built therein.

BRIEF DESCRIPTION OF DRAWINGS

FIG. 3A is a cross-sectional view used to describe a structural example of a terminal of a semiconductor element to be built in.

FIG. 3B is a cross-sectional view used to describe another structural example of a terminal of the semiconductor element to be built in.

FIG. 4 is a cross-sectional view used to describe yet another structural example of a terminal of the semiconductor element to be built in.

FIG. 5 is a plan view used to describe a layout example of terminals of the semiconductor element to be built in.

DESCRIPTION OF EMBODIMENTS

Figure 1:
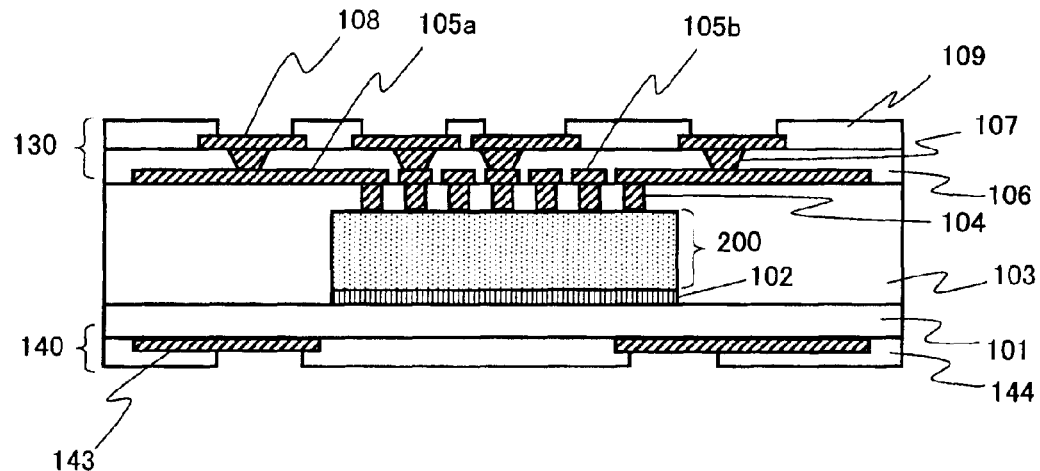
FIG. 1 is a cross-sectional view illustrating a wiring substrate in accordance with a first exemplary embodiment of the present invention.

Exemplary embodiments of the present invention will be described.

A wiring substrate in accordance with the present exemplary embodiment includes a semiconductor element (for example, an IC chip such as an LSI chip) built therein, a peripheral insulating layer covering at least an outer circumferential side surface of this semiconductor element, and an upper surface-side wiring line provided on the upper surface side of the wiring substrate. The wiring substrate may further include a base insulating layer, and the semiconductor element and the peripheral insulating layer may be provided on this base insulating layer.

This semiconductor element includes, on the upper surface side thereof, an internal terminal electrically connected to the upper surface-side wiring line. This internal terminal includes a first conductive part exposed out of an insulating surface layer of this semiconductor element, an adhesion layer on this first conductive part, and a second conductive part on this adhesion layer.

This adhesion layer is provided on a portion of the insulating surface layer around an exposed surface of the first conductive part, so as to cover this exposed surface. That is, this adhesion layer has contact with the exposed surface of the first conductive part and the surface of the insulating surface layer. In addition, this adhesion layer extends around the outer side of an outer edge of this second conductive part, so as to surround the second conductive part. The outer edge of the adhesion layer is located outside the outer edge of the second conductive part. That is, the outer edge of the second conductive part (outer edge of a surface in contact with the adhesion layer) is located inside the outer edge of the adhesion layer (outer edge of a surface in contact with the insulating surface layer).

As the material of this adhesion layer, there is used an electroconductive material superior in adhesiveness to both an insulating material of the insulating surface layer of the semiconductor element and an electroconductive material of the second conductive part. The material of this adhesion layer is desirably superior in adhesiveness to also an electroconductive material of the first conductive part. No particular restrictions apply as long as the material of the adhesion layer is such an electroconductive material. It is possible, however, to suitably use a metal selected from the group consisting of Ti, W, Mo, Cr, V, Ta and Ni, or an alloy made of more than one type thereof, which are superior in adhesiveness to both a resin material and a metal material, or a metal material using any one of these metals or the alloy as a base material. Of these materials, Ti or W, or a metal material using Ti or W as a base material is preferred. The amount of base material contained in this metal material is preferably 70% by mass or higher, more preferably 80% by mass or higher, and even more preferably 90% by mass or higher.

As the material of the second conductive part, it is possible to use a metal selected from the group consisting of gold, silver, copper, nickel, tin and palladium, or an alloy made of more than one type thereof, or a metal material using any one of these metals or the alloy as a base material. The amount of base material contained in this metal material is preferably 70% by mass or higher, more preferably 80% by mass or higher, and even more preferably 90% by mass or higher.

From the viewpoint of conductive properties, processability and cost, copper or a copper-based alloy is preferred.

Examples of the material of the first conductive part of the internal terminal include a usual wiring material if the first conductive part is the exposed portion of the wiring line. It is possible to use, for example, a metal selected from the group consisting of copper, silver, gold, nickel, aluminum, titanium, molybdenum, tungsten and palladium, or an alloy made of more than one type thereof, or a metal material using any one of these metals or the alloy as a base material. The amount of base material contained in this metal material is preferably 70% by mass or higher, more preferably 80% by mass or higher, and even more preferably 90% by mass or higher. From the viewpoint of conductive properties, processability and cost, copper or a copper-based alloy is preferred. If the first conductive part of the internal terminal is a conductive part provided in an opening, it is possible to use a metal selected from the group consisting of copper, aluminum, gold, silver and a solder material, or an alloy made of more than one type thereof, or a metal material using any one of these metals or the alloy as a base material. The amount of base material contained in this metal material is preferably 70% by mass or higher, more preferably 80% by mass or higher, and even more preferably 90% by mass or higher. A barrier layer made of Ni or the like may be provided underneath this first conductive part.

The adhesion layer is superior in adhesiveness to the second conductive part and the insulating surface layer of the semiconductor element. In addition, the adhesion layer is made large in the area of contact with the element's insulating surface layer by an extension portion of the adhesion layer surrounding the second conductive part. Consequently, this terminal is less likely to delaminate in reaction to stress applied thereto. Thus, it is possible to enhance connection reliability. In addition, a contact area between the adhesion layer and the second conductive part can be made larger than an exposed area of the first conductive part. Thus, it is possible to further enhance connection reliability.

Yet additionally, a terminal-to-terminal region can be utilized to enlarge a contact area between the adhesion layer and the element's insulating surface layer by providing a structure in which an integrally-formed adhesion layer is shared between adjacent terminals which are allowed to be electrically coupled with each other. Thus, it is possible to further increase the adhesion strength of terminals. For example, adhesion strength can be increased and an effect of potential stabilization can be attained by disposing terminals, so that power supply terminals are adjacent to each other, and sharing an integrally-formed adhesion layer between these power supply terminals. Still additionally, adhesion strength can be increased and an effect of potential stabilization can be attained by disposing terminals, so that ground terminals are adjacent to each other, and sharing an integrally-formed adhesion layer between these ground terminals.

The second conductive part can be shaped so that the peripheral length of an outer edge of the lower surface of the second conductive part in contact with the adhesion layer is greater than the peripheral length of the upper-surface outer edge of the second conductive part and that the peripheral length of the outer edge of a cross section of the second conductive part along the planar direction of the wiring substrate gradually increases in a direction from the upper surface side to the lower surface side thereof. For example, the second conductive part can be formed of a taper shape in which the outer diameter of the lower surface (surface in contact with the adhesion layer) of the second conductive part is larger than the outer diameter of the upper surface side. Consequently, it is possible to further increase the adhesion strength of terminals and further enhance connection reliability.

Preferably, a wiring line (lower surface-side wiring line) is provided on the lower surface side of the wiring substrate. In this case, a lateral-to-element via electrically connected to this lower surface-side wiring line and the upper surface-side wiring line is preferably provided in the peripheral insulating layer.

If the wiring line is not provided on the lower surface side of the wiring substrate, it is preferable to provide a supporting substrate on the lower surface side of the wiring substrate. As the supporting substrate, it is possible to use a substrate made of an inorganic material, a metal material, a resin material, or the like. Examples of the substrate material include Si, glass, ceramic, copper, a copper-based alloy, aluminum, an aluminum alloy, a stainless material, polyimide resin, and epoxy resin. The semiconductor element and the peripheral insulating layer can be provided on the supporting substrate.

A base insulating layer may be provided on the lower surface side of the wiring substrate, from the viewpoint of ease of manufacture, the sealability and planarity of the lower surface side of the wiring substrate, and the prevention of the warpage thereof. The semiconductor element and the peripheral insulating layer can be provided on the upper surface side of this base insulating layer. A wiring line (lower surface-side wiring line) can be provided on the lower surface side of this base insulating layer. Alternatively, a supporting substrate can be provided if the lower surface-side wiring line is not provided.

As the upper surface-side wiring line, the wiring substrate of the present exemplary embodiment can include a fan-out wiring line drawn out from immediately above the built-in semiconductor element to a peripheral region (upper surface of the peripheral insulating layer) outside the outer edge of the semiconductor element. This fan-out wiring line can be electrically connected to a wiring line within the semiconductor element through the internal terminal mentioned earlier. In addition, this fan-out wiring line can be electrically connected to the lower surface-side wiring line through the above-mentioned lateral-to-element via.

The semiconductor element to be built in the wiring substrate of the present exemplary embodiment can include a semiconductor substrate; a first wiring structure layer including first wiring lines and first insulating layers alternately provided on this semiconductor substrate; and a second wiring structure layer including second wiring lines and second insulating layers alternately provided on this first wiring structure layer. The upper surface-side wiring line can be electrically connected to the first wiring lines through the second wiring lines.

The thickness of each second wiring line is greater than the thickness of each first wiring line but less than the thickness of the upper surface-side wiring line.

Each second insulating layer is formed of a resin material, and the thickness of the layer is greater than the thickness of each first insulating layer. The second insulating layer is formed of a material different from the material of the first insulating layer. As the material of the first insulating layer, a material with priority to electrical characteristics and high processing accuracy is used. In contrast, a reliability-oriented highly tough resin material is preferably used as the material of the second insulating layer. Consequently, it is possible to improve resistance to impact even if the thickness of the semiconductor element is reduced. In addition, a stress relaxation effect can be attained by the second wiring structure layer including the second insulating layer made of such a resin material. The second wiring structure layer preferably includes, as the second insulating layer, an insulating layer lower in elastic modulus than the first insulating layer. It is also preferable for the second insulating layer to not include a filler.

The first wiring structure layer can include, as the first insulating layer, an insulating layer made of an inorganic insulating material, from the viewpoint of processing accuracy and the like. The first wiring structure layer may also include, as the first insulating layer, an insulating layer made of a low-dielectric constant material, from the viewpoint of electrical characteristics. The first wiring structure layer may include both the insulating layer made of an inorganic insulating material and the insulating layer made of a low-dielectric constant material. The first wiring structure layer may include an insulating layer made of an organic insulating material.

The second wiring lines are preferably formed using a design rule different from the design rule of the first wiring lines, the design rule of the upper surface-side wiring line, and the design rule of the lower surface-side wiring line. In addition, the minimum width and the minimum pitch of each second wiring line are preferably greater than the minimum width and the minimum pitch of each first wiring line, respectively, and less than the minimum widths and the minimum pitches of the upper surface-side wiring line and the lower surface-side wiring line, respectively.

The thickness of each second wiring line is greater than the thickness of each first wiring line, and the thickness of each second insulating layer is greater than the thickness of each first insulating layer. Each second wiring line preferably has a thickness twice or more, more preferably three times or more, greater than the thickness of each first wiring line. Each second insulating layer preferably has a thickness twice or more, more preferably three times or more, greater than the thickness of each first wiring line. In addition, each second wiring line preferably has a thickness twice or more greater than the thickness of each first wiring line, and each second insulating layer has a thickness twice or more greater than the thickness of each first insulating layer. Yet additionally, each second wiring line more preferably has a thickness three times or more greater than the thickness of each first wiring line, and each second insulating layer more preferably has a thickness three times or more greater than the thickness of each first insulating layer.

The entire lower surface of the second wiring structure layer is provided on the upper surface of the first wiring structure layer. In addition, the outer circumferential side surface of the second wiring structure layer, along with the outer circumferential side surfaces of the first wiring structure layer and semiconductor substrate, can constitute an outer circumferential side surface of the semiconductor element. In addition, the outer circumferential side surface of the second wiring structure layer may be located on the inner side of the outer circumferential side surface of the first wiring structure layer. That is, the outer circumferential side surface of the second wiring structure layer may be located inside the outer edge of the upper-surface of the first wiring structure layer. Yet additionally, the outer circumferential side surface of the second wiring structure layer may be inclined inward to form a taper shape.

The first wiring structure layer preferably includes, on the upper surface side thereof, a first connecting part connected to the second wiring line. The second wiring structure layer preferably includes, on the upper surface side thereof, a second connecting part (internal terminal) conductive to the first connecting part and connected to the fan-out wiring line. In addition, this second connecting part is preferably relocated in a direction from the position of the first connecting part toward the outer edge side of the semiconductor element.

The wiring substrate of the present exemplary embodiment can include a protective insulating film for covering the upper surface-side wiring line, this protective insulating film having an opening, and include an external terminal made of a portion of the upper surface-side wiring line exposed in this opening or an external terminal made of a conductive part provided in this opening.

The wiring substrate of the present exemplary embodiment can include an upper surface-side wiring structure layer including wiring lines and insulating layers alternately provided on this wiring substrate. This upper surface-side wiring structure layer includes at least the above-mentioned fan-out wiring line as a lowermost layer-side wiring line. This fan-out wiring line can be electrically connected to a wiring line provided on the upper layer side.

Each insulating layer of the upper surface-side wiring structure layer can be formed of a resin material different from the material of the second insulating layer. This insulating layer of the upper surface-side wiring structure layer can contain a filler, whereas the second insulating layer preferably does not contain a filler.

The thickness of each wiring line of the upper surface-side wiring structure layer is preferably greater than the thickness of the second wiring line. In addition, the thickness of the insulating layer of the upper surface-side wiring structure layer is preferably greater than the thickness of the second insulating layer. Each wiring line of the upper surface-side wiring structure layer more preferably has a thickness twice or more greater than the thickness of the second wiring line. Each insulating layer of the upper surface-side wiring structure layer more preferably has a thickness twice or more greater than the thickness of the second insulating layer.

If the wiring substrate of the present exemplary embodiment includes the above-described upper surface-side wiring structure layer, the wiring substrate may include an insulating layer having an opening on the uppermost layer side thereof, and may include an external terminal made of a portion of the upper surface-side wiring line exposed in this opening or an external terminal made of a conductive part provided in this opening.

The wiring substrate of the present exemplary embodiment may include a lower surface-side wiring structure layer including insulating layers and wiring lines alternately provided on the lower surface side of the wiring substrate. This lower surface-side wiring structure layer includes the above-mentioned lower surface-side wiring line as an uppermost layer-side wiring line.

If the wiring substrate of the present exemplary embodiment includes the above-mentioned lower surface-side wiring structure layer, the wiring substrate may include an insulating layer having an opening on the lowermost layer side thereof, and may include an external terminal made of a portion of the upper surface-side wiring line exposed in this opening or an external terminal made of a conductive part provided in this opening.

The wiring substrate of the present exemplary embodiment may include, in place of the lower surface-side wiring structure layer, a protective insulating film covering the lower surface-side wiring line, this protective insulating film including an opening, and may include an external terminal made of a portion of the lower surface-side wiring line exposed in this opening or an external terminal made of a conductive part provided in this opening.

The above-mentioned peripheral insulating layer can be formed of a resin material, and this resin material may contain a filler or a reinforcing material made of woven or unwoven fabric.

In the wiring substrate of the present exemplary embodiment, the peripheral insulating layer can be made to cover the outer circumferential side surface of the mounted semiconductor element without covering the upper surface (terminals in particular) thereof. Thus, the fan-out wiring line can be provided so as to lead from an upper-surface terminal of this semiconductor element onto this peripheral insulating layer. Alternatively, this peripheral insulating layer can be made to cover the upper surface and outer circumferential side surface of the mounted semiconductor element. Thus, the fan-out wiring line can be provided so as to lead from a portion of this peripheral insulating layer immediately above the semiconductor element (a via for connection with the element's terminal or an exposed portion of a post) to a region outside the outer edge of the semiconductor element.

In the wiring substrate of the present exemplary embodiment, a circuit pattern may be provided on the lower surface side of the semiconductor element with a bonding layer therebetween. In that case, the bonding layer can be formed as an insulating layer and the circuit pattern can be set at a ground potential to attain a noise shielding effect. Alternatively, the bonding layer can be formed as an electroconductive layer and the circuit pattern can be set at the power supply potential of the semiconductor element to attain an effect of operational stabilization thereof.

A semiconductor element to be mounted can include, on the lower surface side of a semiconductor substrate thereof, a third wiring structure layer including a third wiring line and a third insulating layer. Third wiring lines and third insulating layers can be provided alternately to form a multilayer structure. This third wiring line may be electrically connected to a wiring line of the lower surface-side wiring structure layer. This semiconductor element can include an intra-element via penetrating through the semiconductor substrate. A wiring line (first wiring line or the like) within the semiconductor element and the third wiring line can be electrically connected to each other through this intra-element via.

In the description of the present invention, comparison of wiring line thicknesses and comparison of insulating layer thicknesses between a wiring structure layer located on the upper layer side and a wiring structure layer located on the lower layer side refers, respectively, to comparing between the minimum thicknesses of the wiring line and the insulating layer of the wiring structure layer located on the upper layer side and the maximum thicknesses of the wiring line and the insulating layer of the wiring structure layer located on the lower layer side. For example, the notion that "the thickness of the second wiring line is greater than the thickness of the first wiring line" means that the minimum thickness of the second wiring line is greater than the maximum thickness of the first wiring line. Likewise, the notion that "the second wiring line has a thickness twice or more greater than the thickness of the first wiring line" means that the minimum thickness of the second wiring line is twice or more greater than the maximum thickness of the first wiring line.

In the present exemplary embodiment, the thickness of the first wiring line can be set to 0.08 μm or greater but not greater than 1.6 μm, preferably 0.1 μm or greater but not greater than 1.2 μm. In that case, the thickness of the second wiring line is preferably set to 3 μm or greater but not greater than 12 μm, and more preferably 5 μm or greater but not greater than 10 μm. The thickness of a wiring line of the upper surface-side wiring structure layer is preferably set to be greater than the set thickness of the second wiring line.

Figure 10A:
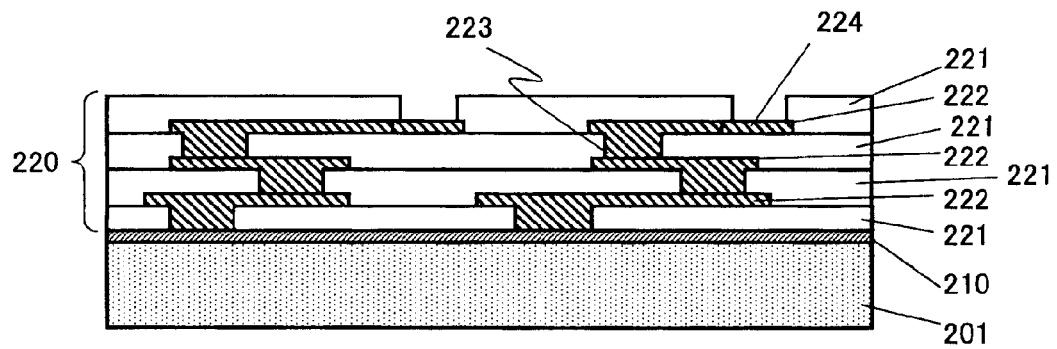
FIG. 10A is a cross-sectional view illustrating a semiconductor element to be mounted on the wiring substrate in accordance with the third exemplary embodiment.
Figure 10B:
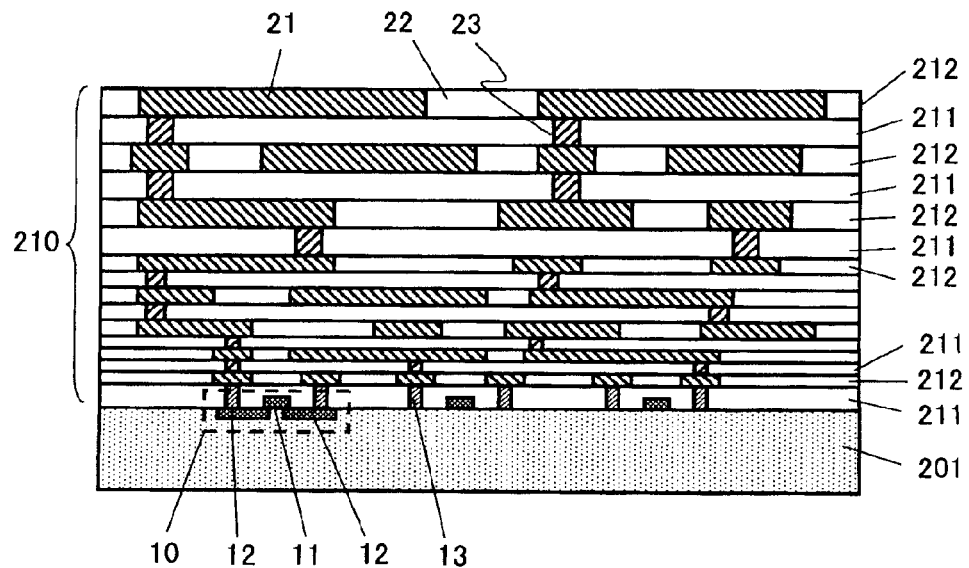
FIG. 10B is a partial cross-sectional view illustrating a first wiring structure layer in the semiconductor element to be mounted on the wiring substrate in accordance with the third exemplary embodiment.

The thickness of each insulating layer can be set as appropriate, according to the thickness of each wiring line, whereas the thickness of the first insulating layer (a length in a direction perpendicular to the substrate from the lower surface of a wiring line-containing layer 212 to the upper surface of an interlayer insulating film 211 in FIG. 10B) can be set to 0.09 μm or greater but not greater than 3.0 μm, and is preferably set to 0.1 μm or greater but not greater than 2.0 μm. The thickness of the second insulating layer can be set to, for example, 3 μm or greater, and is preferably set to 4 μm or greater but not greater than 30 μm, and more preferably 7 μm or greater but not greater than 20 μm. The thickness of the insulating layer of the upper surface-side wiring structure layer is preferably set to be greater than the set thickness of the second insulating layer.

In the description of the present invention, the thickness of each insulating layer provided alternately with each wiring line in each wiring structure layer is defined as a length along the thickness direction (direction perpendicular to the substrate) from the upper surface of an insulating layer abutting on the lower surface of a lower layer-side wiring line to the upper surface of an insulating layer abutting on the lower surface of an upper layer-side wiring line.

According to an exemplary embodiment in which a semiconductor element includes a first wiring structure layer and a second wiring structure layer, a power supply system's wiring lines and a grounding system's wiring lines can be respectively integrated in the second wiring structure layer provided on the fine first wiring structure layer of the semiconductor element. As a result, it is possible to decrease the number of terminals. This enables the size and pitch of terminals to be increased, and therefore, mountability and connection reliability can be enhanced. In addition, wiring structures and terminals can be formed at pitches sufficiently extended with respect to a pitch within the semiconductor element by using a fan-out wiring line drawn out from the semiconductor element to a peripheral region. Since the number of terminals can be decreased and a wiring pitch and a terminal pitch can be widened as described above, it is possible to build in a higher-density semiconductor element and enhance connection reliability. In addition, since an increased number of signal lines can be drawn out, it is possible to build in a higher-performance semiconductor element.

Also according to such an exemplary embodiment, it is possible to relieve stress caused mainly by thermal deformation, and suppress connection failure, as the result of the second wiring structure layer being present between the upper surface-side wiring line (or upper surface-side wiring structure layer) and the first wiring structure layer.

There is a large difference in the rate of thermal expansion between an insulating material (inorganic material or low-dielectric constant material) of the semiconductor element and an insulating material (resin material) composing a wiring substrate (or a member provided on this wiring substrate) for housing this semiconductor element. Accordingly, stress (particularly transverse stress along a substrate plane) arises in a connecting part (for example, a connecting part between a via and a terminal portion) between the semiconductor element and the wiring substrate at the time of manufacture or use. Thus, the wiring substrate has the problem that this connecting part is liable to breakage. This problem stems from the poor mechanical characteristics of the insulating material of the semiconductor element, and becomes more notable when a low-dielectric constant material (Low-k material) is used. The second insulating layer of the second wiring structure layer in the present exemplary embodiment is formed of a resin material superior in mechanical characteristics, particularly in fracture strength and the percentage of elongation at break which are mechanical strengths, to the material of the first insulating layer. Consequently, stress can be relieved by this second wiring structure layer. From the viewpoint of attaining a sufficient stress relaxation effect, the second wiring structure layer preferably includes, as the second insulating layer, an insulating layer lower in elastic modulus than the first insulating layer. If an upper surface-side wiring structure layer is provided, the second wiring structure layer preferably includes, as the second insulating layer, an insulating layer higher in elastic modulus than the insulating layer of the upper surface-side wiring structure layer. Elastic modulus comparison between these insulating layers is defined as comparison at 25° C. As the material of the second insulating layer and the insulating layer of the upper surface-side wiring structure layer, it is possible to use a material the elastic modulus of which at 25° C. is, for example, 0.15 to 8 GPa. As the material of the first insulating layer, it is possible to use a material the elastic modulus of which at 25° C. is, for example, 4 GPa or higher. As a low-k material, it is possible to use a material the elastic modulus of which at 25° C. is 4 to 10 GPa.

In the description of the present invention, the film strength and the percentage of elongation at break of an insulating layer correspond to measured values based on a tensile test of an insulating material compliant to JIS K 7161 (Tension Characteristic Test). The elastic modulus of the insulating layer corresponds to a value calculated from strength at a distortion of 0.1% based on the results of this tensile test. The rate of thermal expansion of the insulating layer corresponds to a value measured by a TMA method compliant to JIS C 6481.

The second wiring line is preferably formed using a design rule intermediate in size between the design rules of a fine first wiring line and a large-sized upper surface-side wiring line (or a wiring line of the upper surface-side wiring structure layer). Stress concentration at a connecting part due to a precipitous size difference in a case where the second wiring structure layer is not provided, can be appropriately relieved by the second wiring structure layer including such a second wiring line. In addition, the second wiring structure layer has a combination of wiring line and insulation thicknesses fully capable of coping with stress, and can make available a contact area of a via portion fully capable of coping with stress concentrating on the connecting part. As a result, connection strength is available by which an excellent connection condition can be maintained even in case of stress generation. Yet additionally, as described above, a sufficient number of signal lines can be drawn out from the first wiring structure layer by the second wiring structure layer.

The minimum design rules (L/S) of wiring lines in the first wiring structure layer, the second wiring structure layer, the upper surface-side wiring structure layer (or the upper surface-side wiring line), and the lower surface-side wiring structure layer (or the lower surface-side wiring line) are preferably set as described below (where, L denotes a wiring line width and S denotes a wiring line pitch).

The minimum wiring line design rule of the first wiring structure layer is preferably L/S=0.01 μm/0.01 μm. That is, the first wiring line is preferably 0.01 μm or greater in minimum wiring line width and 0.01 μm or wider in minimum wiring line pitch.

The minimum wiring line design rule of the second wiring structure layer is preferably L/S=2 μm/2 μm. That is, the second wiring line is preferably 2 μm or greater in minimum wiring line width and 2 μm or wider in minimum wiring line pitch.

The minimum wiring line design rule of the upper surface-side wiring structure layer (or the upper surface-side wiring line) is preferably L/S=5 μm/5 μm. That is, a wiring line of the upper surface-side wiring structure layer (or the upper surface-side wiring line) is preferably 5 μm or greater in minimum wiring line width and 5 μm or wider in minimum wiring line pitch.

The minimum wiring line design rule of the lower surface-side wiring structure layer (or the lower surface-side wiring line) is preferably L/S=5 μm/5 μm. That is, a wiring line of the lower surface-side wiring structure layer (or the lower surface-side wiring line) is preferably 5 μm or greater in minimum wiring line width and 5 μm or wider in minimum wiring line pitch.

From the viewpoint of yield stabilization, wiring structure layers are preferably set to the design rules described below.

The minimum wiring line design rule of the first wiring structure layer is preferably L/S=0.02 μm/0.02 μm. That is, the first wiring line is preferably 0.02 μm or greater in minimum wiring line width and 0.02 μm or wider in minimum wiring line pitch.

The minimum wiring line design rule of the second wiring structure layer is preferably L/S=5 μm/5 μm. That is, the second wiring line is preferably 5 μm or greater in minimum wiring line width and 5 μm or wider in minimum wiring line pitch.

The minimum wiring line design rule of the upper surface-side wiring structure layer (or the upper surface-side wiring line) is preferably L/S=20 μm/20 μm. That is, a wiring line of the upper surface-side wiring structure layer (or the upper surface-side wiring line) is preferably 20 μm or greater in minimum wiring line width and 20 μm or wider in minimum wiring line pitch.

The minimum wiring line design rule of the lower surface-side wiring structure layer (or the lower surface-side wiring line) is preferably L/S=20 μm/20 μm. That is, a wiring line of the lower surface-side wiring structure layer (or the lower surface-side wiring line) is preferably 20 μm or greater in minimum wiring line width and 20 μm or wider in minimum wiring line pitch.

The chip size of the semiconductor element is preferably 0.2 mm or larger, more preferably 0.5 mm or larger, and even more preferably 2 mm or larger, in the length of a side, from the viewpoint of processing accuracy or the like, if the semiconductor element is polygonal (convex polygon), such as square or rectangular (oblong), in planar shape. From the viewpoint of miniaturization, the chip size is preferably 15 mm or smaller, and more preferably 12 mm or smaller. In this case, the peripheral length of the semiconductor element is preferably 0.8 mm or greater, more preferably 2 mm or greater, and even more preferably 8 mm or greater, but is preferably 60 mm or less, and more preferably 50 mm or less.

Providing a wiring line and a terminal also on the lower surface side of the wiring substrate increases the degree of wiring line design freedom and enables high densification. This also makes it possible to connect other semiconductor devices or electronic components to both the upper and lower surface sides of the wiring substrate, thereby enabling the configuration of a high-density system. In addition, the degree of wiring line design freedom is further increased if the upper surface-side wiring line and the lower surface-side wiring line are electrically connected to each other, thereby enabling higher densification. Yet additionally, a connection can be made at a short distance between semiconductor elements or electronic components provided on the upper and lower surface sides. Thus, device performance can also be improved.

By using an insulating material not containing a filler for the second wiring structure layer of a semiconductor element to be built in, it is possible to easily form a fine, highly-reliable wiring structure compatible with the fine pitch of the first wiring structure layer. As a result, a pitch to be extended in the first wiring structure layer can be kept narrow. Thus, it is possible to realize a reduction in the number of layers in the first wiring structure layer. In addition, the number of layers can also be reduced in the second wiring structure layer by the improvement of a wiring containing rate. Thus, it is possible to reduce manufacturing costs.

The upper surface-side wiring structure layer and the lower surface-side wiring structure layer can be formed using a buildup material for usual printed wiring boards, and therefore, can be manufactured at low cost. In addition, a filler-containing resin material can be used as the material of each insulating layer. Thus, it is possible to enhance heat resistance and mechanical strength. Yet additionally, the differential thermal expansion of the wiring structure layers with respect to the semiconductor element can be reduced to realize a reduction in warpage. Still additionally, a resin material comparatively low in film-forming temperature can be used as the material of an insulating layer. Thus, it is possible to keep process temperature low. As a result, it is possible to reduce the warpage and material deterioration of the substrate as a whole, and thereby, enhance the reliability thereof.

Hereinafter, exemplary embodiments will be described specifically with reference to the accompanying drawings.

First Exemplary Embodiment

FIG. 1 is a cross-sectional view illustrating a wiring substrate in accordance with a first exemplary embodiment.

In the wiring substrate of the present exemplary embodiment, a semiconductor element (LSI chip) 200 is fixed to a base insulating layer 101 with a bonding layer 102 therebetween, as illustrated in FIG. 1. A peripheral insulating layer 103 is provided on the base insulating layer 101, so as to cover the outer circumferential side surface and upper surface of the semiconductor element 200. An upper surface-side wiring structure layer 130 is formed on this peripheral insulating layer 103, so as to cover the semiconductor element 200. A lower surface-side wiring structure layer 140 is formed on the lower surface of the base insulating layer 101 on the lower surface side of this wiring substrate, so as to cover the lower surface of the peripheral insulating layer 103 and the lower surface of the semiconductor element 200. The wiring substrate including the semiconductor element 200 built therein is configured in this way.

This upper surface-side wiring structure layer 130 includes wiring lines 105a, 105b and 108, an insulating layer 106, vias 107, and a protective insulating layer 109. The wiring line 105a is a fan-out wiring line drawn out from immediately above the semiconductor element 200 to a peripheral region outside the element. The wiring line 105b is an electroconductive layer located immediately above the semiconductor element 200. The fan-out wiring line may be drawn out from immediately above the semiconductor element 200 to the peripheral region outside the element through the wiring line 105b. The wiring lines 108 on the upper layer side are electrically connected to the wiring lines 105a and 105b on the lower layer side through the vias 107. A portion of each wiring line 108 exposed in an opening of the protective insulating layer 109 is utilized as an external terminal. A conductive material may be provided in this opening to form a bump. The protective insulating layer 109 can be formed using a solder resist.

Wiring lines on the lowermost layer side of the upper surface-side wiring structure layer 130 include the fan-out wiring line 105a drawn out from immediately above the semiconductor element to a peripheral region outside an outer edge of the semiconductor element, a peripheral wiring line (not illustrated) extending from this fan-out wiring line or connected thereto, and the electroconductive layer 105b immediately above the semiconductor element. The fan-out wiring line is electrically connected to a wiring line within the semiconductor element through a via 104 penetrating through the insulating layer (peripheral insulating layer in the present exemplary embodiment) immediately above the semiconductor element and a terminal on the upper surface of the semiconductor element to which this via is connected. Vias are connected to an extension portion of the fan-out wiring line extending to a peripheral region and the peripheral wiring line, and are electrically connected to upper layer-side wiring lines. The vias are not limited to those connected to the extension portion of the fan-out wiring line and the peripheral wiring line, but may be provided in a region immediately above the semiconductor element. Consequently, wiring structures and external terminals can be formed at a pitch sufficiently extended with respect to a pitch within the semiconductor element.

In the present exemplary embodiment, wiring lines of the upper surface-side wiring structure layer 130 are two-layered. Alternatively, the upper surface-side wiring structure layer 130 may have a multilayer structure in which insulating layers and wiring lines are further provided alternately. Yet alternatively, one layer of the lower layer-side wiring lines 105a and 105b (upper surface-side wiring lines) may be formed without providing the upper layer-side wiring line 108. Then, the protective insulating layer 109 may be provided on the wiring lines 105a and 105b, and portions of the wiring lines exposed in openings of this protective insulating layer may be utilized as external terminals. Still alternatively, a conductive material may be provided in these openings to form bumps. Also in the present exemplary embodiment, the lowermost layer-side wiring lines (105a and 105b) are drawn out from immediately above the semiconductor element 200 to a peripheral region outside the element. It does not matter, however, if the upper layer-side wiring line is alternatively drawn out from immediately above the semiconductor element to a peripheral region outside the element.

Also in the present exemplary embodiment, the peripheral insulating layer 103 is provided so as to cover the upper surface of the semiconductor element 200. Alternatively, the wiring substrate may have a structure in which the peripheral insulating layer 103 covers the outer circumferential side surface of the semiconductor element 200 without covering the upper surface (terminals in particular) thereof. In this structure, second wiring lines of a second wiring structure layer 220 can be connected to the third wiring lines 105a and 105b without being made to go through vias 104. This structure is advantageous in narrow-pitched connection between the second wiring structure layer 220 and the third wiring structure layer 130.

As illustrated in FIG. 1, the lower surface-side wiring structure layer 140 of the present exemplary embodiment includes a single layer of a wiring line 143 on the lower surface of the base insulating layer 101 and a protective insulating layer 144 covering this wiring line. A portion of the wiring line exposed in an opening of this protective insulating layer is utilized as an external terminal. A conductive material may be provided in this opening to form a bump. This protective insulating layer can be formed using a solder resist. In the present exemplary embodiment, wiring lines of the lower surface-side wiring structure layer 140 are single-layered. Alternatively, the lower surface-side wiring structure layer 140 may have a multilayer structure in which insulating layers and wiring lines are further provided alternately. Each insulating layer and each wiring line of the lower surface-side wiring structure layer 140 can respectively be formed of the same materials and by the same methods as those used for the insulating layers and wiring lines of the upper surface-side wiring structure layer 130. Providing the lower surface-side wiring structure layer 140 makes it possible to also utilize the lower surface side of the wiring substrate. Thus, high-density packaging is made feasible in which regions on the rear surface side of the semiconductor element are also utilized. In addition, an effect of suppressing the occurrence of warpage can be attained by making the lower surface-side wiring structure layer and the upper surface-side wiring structure layer close to each other in structure, including the number of laminated wiring lines, the number of laminated insulating layers, and the type of materials.

Figure 3A:
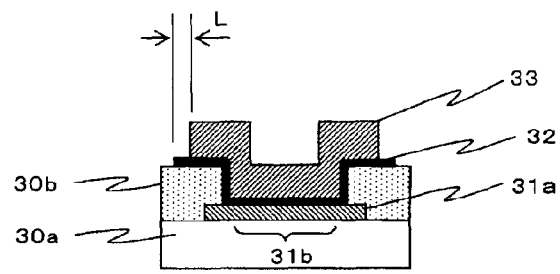
Figure 3B:
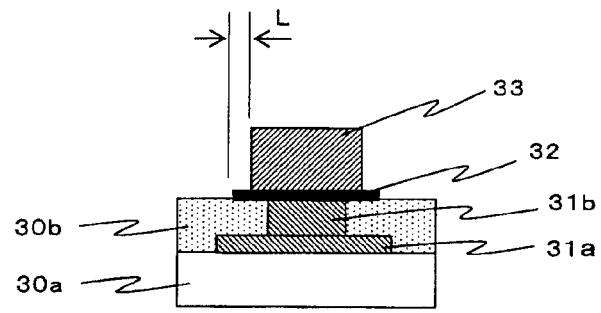
Figure 4:
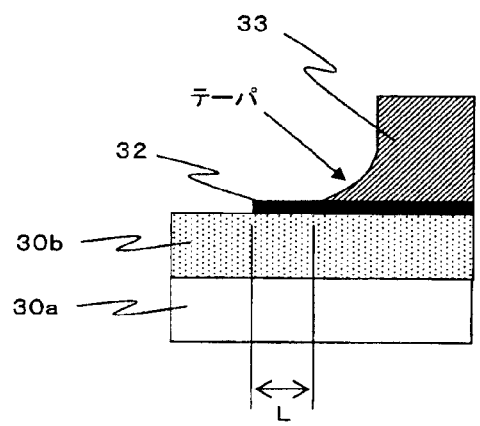

FIGS. 3A, 3B and 4 are partial cross-sectional views used to describe the terminal structure of a semiconductor element to be mounted.

In the terminal structure illustrated in FIG. 3A, an insulating layer 30b (the element's insulating surface layer) having an opening is provided over an electroconductive layer 31a on an insulating layer 30a of the semiconductor element. A surface of the electroconductive layer is exposed out of this opening. An adhesion layer 32 is provided so as to cover this exposed surface (an exposed surface of a first conductive part 31b which is part of the electroconductive layer 31a). An electroconductive layer 33 (second conductive part) is provided on this adhesion layer 32. This electroconductive layer 33 (second conductive part) is located on the inner side of an outer edge of the adhesion layer 32. The outer edges of both the adhesion layer 32 and the electroconductive layer 33 (second conductive part) are located on the outer side of the opening.

In the terminal structure illustrated in FIG. 3B, the insulating layer 30b (the element's insulating surface layer) having an opening is provided over the electroconductive layer 31a on the insulating layer 30a of the semiconductor element. A conductive part 31b (first conductive part) to be connected to the electroconductive layer 31a is provided in this opening. In addition, the adhesion layer 32 is provided so as to cover an exposed surface of this conductive part 31b (first conductive part). The electroconductive layer 33 (second conductive part) is provided on this adhesion layer 32. This electroconductive layer 33 (second conductive part) is located on the inner side of an outer edge of the adhesion layer 32. The outer edges of both the adhesion layer 32 and the electroconductive layer 33 (second conductive part) are located on the outer side of the opening (on the outer side of the outer edge of the conductive part 31b).

As illustrated in these figures, the outer edge of the adhesion layer is located on the outer side of the outer edge of the second conductive part provided thereon. Accordingly, an area of contact of this adhesion layer with the upper surface (insulating surface layer) of the semiconductor element is made larger. Consequently, the adhesion layer is less likely to delaminate in reaction to stress applied to this terminal part. Thus, it is possible to enhance the connection reliability of the terminal part.

In such a terminal part, the outer circumferential side surface of the electroconductive layer 33 (second conductive part) on the adhesion layer 32 may be inclined inward, as illustrated in, for example, FIG. 4. That is, the electroconductive layer 33 may form a taper shape in which the outer diameter of the electroconductive layer 33 becomes increasingly larger from the upper surface side to the lower surface side. Consequently, the second conductive part on the adhesion layer becomes less likely to delaminate. Thus, it is possible to further enhance the connection reliability of the terminal part. Note that FIG. 4 is an enlarged view of the left-side part of the cross section of the terminal part shown in FIG. 3B, and that the electroconductive layers 31a and 31b are omitted from the figure.

Figure 5:
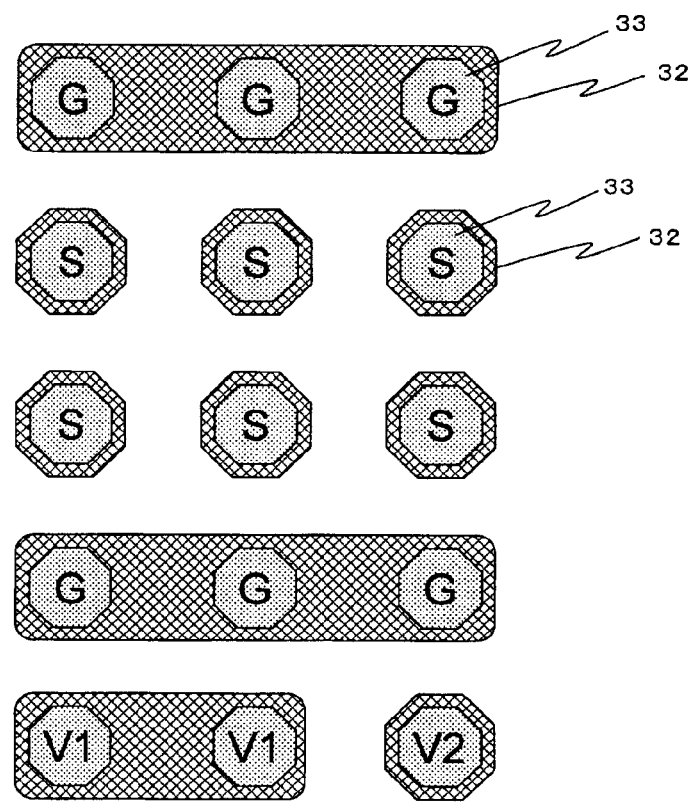

FIG. 5 illustrates a terminal layout of the semiconductor element. Reference character S in the figure denotes a signal terminal, reference character G denotes a ground terminal, reference character V1 denotes a power supply terminal 1 (for example, 1.2 V), and reference character V2 denotes a power supply terminal 2 (for example, 1.5 V). As illustrated in the figure, power supply terminals set to the same potential are laid out so as to be adjacent to each other, and an integrally-formed adhesion layer is shared between these power supply terminals. Consequently, it is possible to attain a potential stabilization effect. Likewise, ground terminals are laid out so as to be adjacent to one another, and an integrally-formed adhesion layer is shared among these ground terminals. Consequently, it is possible to also attain a potential stabilization effect. The number of adjacent terminals is not limited to two but may be three or larger, as illustrated in FIG. 5. In addition, the planar shape of an adhesion layer to be shared is not limited to a linear shape. The planar shape can be a variety of shapes, including an L shape, a T shape and a U shape, according to a layout of terminals. The planar shape of a second conductive part of each terminal is not limited in particular, as long as the outer edge of the second conductive part is located on the inner side of the outer edge of an adhesion layer and a sufficient strength of adhesion to the adhesion layer is secured. For example, the second conductive part can be formed into a polygon, such as a quadrangle or an octagon, or a circle. The planar shape of a nonshared adhesion layer is not limited in particular, as long as the outer edge thereof is provided on the outer side of the outer edge of a second conductive part provided immediately above the adhesion layer and a sufficient adhesion strength is secured. For example, the adhesion layer can be formed into a shape (similarity shape) adapted to the planar shape of the second conductive part, as illustrated in FIG. 5.

From the viewpoint of the effect of connection reliability enhancement by an adhesion layer, and manufacturing stability, such as alignment accuracy and etching accuracy, at the time of terminal fabrication, a distance L between the outer edge of the adhesion layer and the outer edge of the second conductive part provided thereon is preferably set to 0.3 μm or longer, and more preferably 0.5 μm or longer. This distance L corresponds to a length denoted by L in FIGS. 3A, 3B and 4. This distance L is defined as the minimum distance from an arbitrary point in the outer edge of the adhesion layer to the outer edge of the second conductive part. Here, the outer edge of the adhesion layer and the outer edge of the second conductive part respectively refer to the outer edge of a projection geometry of the lower surface of the adhesion layer and the outer edge of a projection geometry of the lower surface of the second conductive part, the projection geometries being projected onto the same substrate plane.

In addition, this distance L is preferably set by taking into consideration the prevention of shortcircuiting among unconnected terminals. If this distance L is set to too large a value and a space between adhesion layers among the unconnected terminals is too narrow, terminal-to-terminal insulation becomes insufficient, and therefore, reliability degrades. This leads to difficulty in fully removing an adhesion layer among terminals during manufacture. Thus, such problems as terminal-to-terminal shortcircuiting become liable to occur. From these points of view, the space between adhesion layers among unconnected terminals is preferably 2 μm or wider, and more preferably 5 μm or wider. In addition, the distance L is preferably set so as to be able to secure such a space.

Terminals of the semiconductor element can be fabricated as described below.

First, an adhesion metal-containing power supply layer is formed on an insulating surface layer of a semiconductor element on which a first conductive part is exposed by, for example, a sputtering method, an evaporation method, an electrolytic plating method or a nonelectrolytic plating method.

Next, a plating resist having an opening used to form a second conductive part is formed on the power supply layer. Subsequently, metal is deposited within the opening by an electrolytic plating method or a nonelectrolytic plating method to form the second conductive part. Thereafter, the plating resist is removed.

Next, a resist mask covering the second conductive part and having a predetermined pattern shape of an adhesion layer is formed and the power supply layer is etched to obtain a power supply layer (adhesion layer) having a predetermined pattern shape. Thereafter, the resist mask is removed. This patterning of the power supply layer can be performed after a semiconductor element which is a diced individual chip is fixed onto a later-described supporting substrate.

Terminals of the semiconductor element can also be fabricated as described below.

First, the second conductive part is formed on the power supply layer in the same way as described above.

Next, the plating resist used to form the second conductive part is removed, and the power supply layer is also removed using the second conductive part as a mask, by performing wet etching or dry etching. Consequently, there is obtained a power supply layer (adhesion layer) substantially the same in planar shape as the second conductive part.

Next, etching is performed using an etchant having etchability with respect to the metal of the second conductive part but having no etching capability to the metal of the adhesion layer, or an etchant the etching rate (Rb) of which for the metal of the second conductive part is higher than the etching rate (Ra) for the metal of the adhesion layer (for example, Rb/Ra>3). Consequently, the upper and side surfaces of the second conductive part are etched, and therefore, the outer diameter thereof decreases, whereas the adhesion layer is not etched or etching is less progressive therein. As a result, the outer edge of the adhesion layer becomes exposed around the second conductive part. According to this method, the side surface of the second conductive part easily becomes tapered. Thus, it is possible to form an adequate taper shape by adjusting etching conditions as appropriate. This etching of the second conductive part can be performed after the semiconductor element which is a diced individual chip is fixed onto the later-described supporting substrate.

In the present exemplary embodiment, one semiconductor element is built in one wiring substrate. Alternatively, a plurality of semiconductor elements may be built in one wiring substrate.

A semiconductor substrate 201 of the semiconductor element to be built in is ground, before fixation, so as to have a predetermined thickness, and a bonding layer 102 is provided on the surface thus ground.

As the semiconductor substrate 201, it is possible to use a substrate made of, for example, silicon, germanium, gallium arsenide (GaAs), gallium arsenide phosphide, gallium nitride (GaN), silicon carbide (SiC), zinc oxide (ZnO), any other compound semiconductor (II-VI group compound, III-V group compound, or VI group compound), or diamond, though the material of the substrate is not limited to these. As the semiconductor element of the present exemplary embodiment, it is possible to suitably use an LSI chip using a silicon substrate. The thickness of the semiconductor substrate 201 can be set to, for example, 50 μm, and the chip size thereof can be set to, for example, 10 mm square.

No particular restrictions apply to the bonding layer 102, as long as the semiconductor element can be fixed onto the base insulating layer 101 with a desired strength. As the bonding layer, it is possible to use, for example, partially-cured resin referred to as a die attachment film (DAF), resin paste, such as epoxy resin, polyimide resin, BCB (benzocyclobutene) or PBO (polybenzoxazole), or silver paste.

The upper surface-side wiring structure layer 130 can be formed using a usual printed-wiring substrate manufacturing technique. In particular, it is possible to suitably form the upper surface-side wiring structure layer 130 by using a buildup method applied to the formation of an interposer substrate.

A wiring line of the upper surface-side wiring structure layer 130 or an upper surface-side wiring line can be formed by a subtractive method, a semi-additive method, a full-additive method, or the like.

As the material of this wiring line, it is possible to use a metal material composed of one or more than one type of material selected from the group consisting of copper, silver, gold, nickel, aluminum, titanium, molybdenum, tungsten and palladium. From the viewpoint of electrical resistance values and cost, copper is particularly desirable. For example, an approximately 10 μm-thick wiring line made of copper can be formed by a semi-additive method.

As the material of an insulating layer of the upper surface-side wiring structure layer 130, it is possible to suitably use a resin insulating material. For example, the insulating layer can be formed using a photosensitive or nonphotosensitive organic material. Examples of this resin insulating material include epoxy resin, epoxy acrylate resin, urethane acrylate resin, polyester resin, phenol resin, polyimide resin, BCB (benzocyclobutene), PBO (polybenzoxazole), and polynorbornene resin. Examples of the resin insulating material also include a composite material in which a reinforcing material, such as woven fabric or unwoven fabric, made of glass cloth or aramid fiber is impregnated with any one of those types of resins, those types of resins containing an inorganic filler or an organic filler, and silicon resin (silicone resin). From the viewpoint of forming irregularities on a surface in order to enhance adhesiveness to a 10 μm-thick wiring line, it is possible to use, for example, epoxy resin containing, for example, a filler advantageous in forming irregularities, as the material of the insulating layer.

The insulating layer of the upper surface-side wiring structure layer 130 can be formed using, for example, a transfer molding method, a compression molding method, a printing method, a vacuum pressing method, a vacuum laminating method, a spin coating method, a die coating method, a curtain coating method, or a photolithographic method. The insulating layer can be satisfactorily formed by, for example, a vacuum laminating method using filler-containing epoxy resin.

The base insulating layer 101 can be formed using a material and a method used to form the insulating layer of the upper surface-side wiring structure layer.

The peripheral insulating layer 103 is preferably superior in adhesiveness to the side and upper surfaces of the semiconductor element 200, easy to be molded under relatively low temperatures, and less likely to cause the warpage of a device as a whole. Accordingly, a resin material is preferable, and the peripheral insulating layer 103 can be formed of, for example, a photosensitive or nonphotosensitive organic material. Examples of this resin material include epoxy resin, epoxy acrylate resin, urethane acrylate resin, polyester resin, phenol resin, polyimide resin, BCB (benzocyclobutene), PBO (polybenzoxazole), and polynorbornene resin. Examples of the resin insulating material also include a composite material in which a reinforcing material, such as woven fabric or unwoven fabric, made of glass cloth or aramid fiber is impregnated with any one of those types of resins or the like, those types of resins containing an inorganic filler or an organic filler, and silicon resin (silicone resin). It is possible to suitably use, for example, epoxy resin.

The peripheral insulating layer 103 can be formed by providing an insulating layer made of such a resin material on the base insulating layer 101 (or a supporting substrate to be removed later) by a vacuum laminating method, a vacuum pressing method, or the like, so as to cover the semiconductor element 200. The peripheral insulating layer may be formed of a single resin layer or a laminated body composed of a plurality of resin layers. The peripheral insulating layer, if made of a laminated body, may be formed by going through a plurality of separate steps. In a case where a resin layer containing a reinforcing material made of glass cloth, aramid fiber or the like is to be provided, the peripheral insulating layer can be formed using a resin layer having an opening capable of accommodating the semiconductor element.

A connection between a terminal of the semiconductor element and the lowermost layer-side wiring line of the upper surface-side wiring structure layer 130 (or the upper surface-side wiring line) can be made in the following way, for example.

After the peripheral insulating layer 103 covering the semiconductor element is formed, an opening is formed in an insulating layer (peripheral insulating layer) immediately above the semiconductor element by a laser or the like, so that a terminal of the semiconductor element becomes exposed. A conductive material is filled in this opening to form a via. Then, a wiring line is formed so as to connect to this via. Alternatively, an electroconductive film for filling the opening is formed, and this electroconductive film is patterned to form the wiring line and the via.

In another method, a bump (also referred to as "post") is previously formed on a terminal of the semiconductor element. The semiconductor element in which this bump is formed is fixed to a base insulating layer or a supporting substrate. Subsequently, the peripheral insulating layer 103 is formed, and a portion of the insulating layer (peripheral insulating layer) on the bump is removed to expose the upper surface thereof. Then, a wiring line is formed so as to connect to the exposed portion of this bump. If the second conductive part of the terminal has a sufficient height, the insulating layer covering the semiconductor element is formed without providing the bump on the terminal. Then, a portion of the insulating layer on the terminal is removed to expose the upper surface thereof (second conductive part). Thus, the wiring line can be connected to the exposed portion of this terminal.

Note that the semiconductor element may include a terminal connected to the upper layer-side wiring line through a via, in addition to the terminal connected to the lowermost layer-side wiring line of the upper surface-side wiring structure layer (or the upper surface-side wiring line).

Second Exemplary Embodiment

Figure 2:
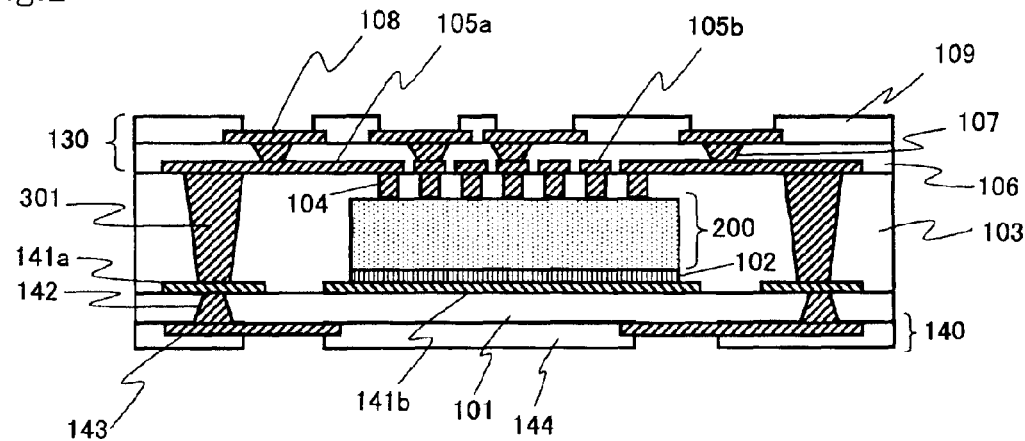
FIG. 2 is a cross-sectional view illustrating a wiring substrate in accordance with a second exemplary embodiment of the present invention.

FIG. 2 is a cross-sectional view illustrating a wiring substrate in accordance with a second exemplary embodiment of the present invention.

In the present exemplary embodiment, a lateral-to-element via 301 penetrating through a peripheral insulating layer 103 is provided. Through this lateral-to-element via, a wiring line 105a of an upper surface-side wiring structure layer is electrically connected to a wiring line 143 of a lower surface-side wiring structure layer. The wiring substrate can have the same structure as that of the first exemplary embodiment, except structural elements related to the lateral-to-element via.

In the example illustrated in FIG. 2, the lower end of the lateral-to-element via 301 is connected to a connecting pad 141a on the base insulating layer 101, the upper end of a via 142 penetrating through the base insulating layer 101 is connected to the lower surface of this connecting pad 141a, and the lower end of this via 142 is connected to the upper surface of the wiring line 143. The connecting pad 141a is used to facilitate connection between upper and lower vias, and can be provided as necessary. In the present exemplary embodiment, the lateral-to-element via 301 penetrates through the peripheral insulating layer 103. If the peripheral insulating layer is a laminated body, vias are provided in respective insulating layers constituting this laminated body. Thus, the wiring substrate can have a stack structure in which these vias are connected to each other or one another, or a staggered structure in which the vias are displaced from each other or one another. In addition, if the peripheral insulating layer is three- or more-layered, the wiring substrate can have a structure in which a stack structure and a staggered structure are mixedly present.

A circuit pattern 141b can be provided on the lower surface side of the semiconductor element 200 with a bonding layer 102 therebetween. This circuit pattern, if formed of the same material as that of the connecting pad 141a, can be formed simultaneously with the formation of the connecting pad. If the bonding layer 102 is formed as an insulating layer and the circuit pattern is set at a ground potential, it is possible to attain a noise shielding effect. Alternatively, if the bonding layer 102 is formed as an electro conductive layer and the circuit pattern is set at a power supply potential, it is possible to attain an effect of power supply potential stabilization.

According to the structure of the present exemplary embodiment in which the lateral-to-element via 301 is provided as described above, it is possible to provide a wiring line and a terminal to be electrically connected to a built-in semiconductor element also on the lower surface side of the wiring substrate. Consequently, the degree of wiring line design freedom increases and high densification is feasible. In addition, other semiconductor devices and electronic components to be electrically connected to the built-in semiconductor element can also be connected to the lower surface side of the wiring substrate. Thus, it is possible to configure a high-density system. Yet additionally, semiconductor elements or electronic components connected to the upper surface side and the lower surface side can be connected to each other at a short distance. Thus, it is possible to improve device performance.

Third Exemplary Embodiment

Figure 9:
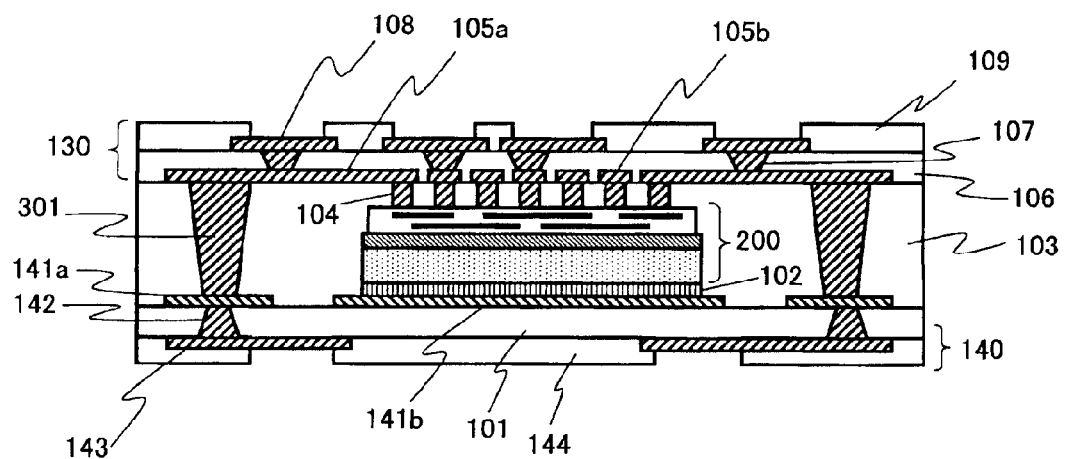
FIG. 9 is a cross-sectional view illustrating a wiring substrate in accordance with a third exemplary embodiment of the present invention.

FIG. 9 is a cross-sectional view illustrating a wiring substrate in accordance with a third exemplary embodiment of the present invention.

As illustrated in FIG. 10A, a semiconductor element 200 built in the wiring substrate of the present exemplary embodiment includes a semiconductor substrate 201; a first wiring structure layer 210 on this semiconductor substrate; and a second wiring structure layer 220 on this first wiring structure layer. The rest of the structure of the present exemplary embodiment, except the structure of the semiconductor element of the wiring substrate, is the same as the structure of the second exemplary embodiment. Alternatively, the present exemplary embodiment may be the same in structure as the first exemplary embodiment, except the structure of the semiconductor element.

As illustrated in FIG. 10A, the second wiring structure layer 220 includes second insulating layers 221, second wiring lines 222, and second vias 223, where the second insulating layers 221 and the second wiring lines 222 are laminated alternately. In this laminated structure, an upper layer-side second wiring line and a lower layer-side second wiring line are connected to each other by a second via 223 penetrating through the second insulating layer between these wiring lines. The lowermost layer-side second wiring line is connected to a conductive part on a surface of the first wiring structure layer 210 by a second via penetrating through the lowermost layer-side second insulating layer (second insulating layer on the first wiring structure layer 210). As illustrated in FIG. 10A, the lowermost-layer part of the second wiring structure layer 220 includes an insulating layer 221 provided on the first wiring structure layer 210, a wiring line 222 provided on this insulating layer, and a via 223 for connecting this wiring line and a conductive part (not illustrated) on the upper surface of the first wiring structure layer. Alternatively, a wiring line may be directly formed on the first wiring structure layer, so as to directly connect to the conductive part (not illustrated) on the upper surface of the first wiring structure layer 210. In addition, the second wiring structure layer 220 is not limited to the number of layers shown in FIG. 10A. The second wiring structure layer 220 may be structured so as to have one or more layers of wiring lines, or may have a structure in which one or more layers of wiring lines and insulating layers are laminated alternately. Thus, the second wiring structure layer 220 may have a number of layers greater than that shown in FIG. 10A.

The above-mentioned terminal can be formed in an exposed portion 224 of an electroconductive layer on the upper surface side of the second wiring structure layer 220.

As illustrated in FIG. 10B, the first wiring structure layer 210 is provided on the semiconductor substrate 201 in which a function element 10 is formed. As the function element 10, it is possible to provide, for example, a MOS transistor. This MOS transistor is composed of a gate electrode 11 provided on a semiconductor substrate with an intervention of a gate insulating film (not illustrated), and source/drain regions 12 formed on both sides of the gate electrode 11.

An interlayer insulating film (first insulating layer) 211 is provided on the semiconductor substrate 201, so as to cover this function element 10. In addition, a wiring line-containing layer 212 is provided on this interlayer insulating film 211. Yet additionally, interlayer insulating films 211 and wiring line-containing layers 212 are provided while being laminated alternately. Each wiring line-containing layer 212 is composed of wiring lines 21 (first wiring lines) and an inter-wire insulating layer 22 for filling a space between wiring lines 21. Each lowermost layer-side wiring line 21 is electrically connected to a source/drain region 12 or a gate electrode through a contact plug 13 formed in the lowermost layer-side interlayer insulating film 211. An upper layer-side wiring line 21 and a lower layer-side wiring line 21 are electrically connected to each other through a via 23 formed in the interlayer insulating film 211 between these wiring lines. Although FIG. 10B illustrates an example in which a planar MOS transistor is provided, a vertical transistor having a three-dimensional structure, a Fin-type FET, or a transistor made of an organic material may be provided instead.

The first wiring structure layer 210 and the function element 10 can be formed using a usual semiconductor manufacturing process technology.

Examples of the wiring material of the first wiring structure layer 210 include copper and aluminum. Wiring lines of the first wiring structure layer can be formed by, for example, a damascene method. The formation of wiring lines by a damascene method can be performed in the following way, for example. First, an insulating film is formed, and then trenches adapted in shape to a desired wiring pattern or via pattern are formed in this insulating film by using a lithography technique and dry etching technique. Next, a barrier metal layer is formed on the entire surface of the wiring substrate being fabricated, including interiors of these trenches, by a sputtering method, a CVD (Chemical Vapor Deposition) method, an ALD (Atomic Layer Deposition) method, or the like. Then, a power supply layer for electrolytic plating is formed by a sputtering method or the like. Subsequently, a copper film is formed by an electrolytic copper plating method, so as to fill the trenches. Next, the wiring substrate is polished by a CMP (Chemical Mechanical Polishing) method, so that the barrier metal and copper remain only The thickness of each first wiring line 21 can be set to within the range of, for example, 0.08 to 2 μm, and is preferably 0.1 μm or greater. The thickness is preferably 1.6 μm or less, and more preferably 1.2 μm or less, however.

The thickness of each interlayer insulating film 211 (not including an inter-wire insulating film) can be set to within the range of, for example, 0.01 to 2 μm, and is preferably 0.03 μm or greater. The thickness is preferably 1.6 μm or less, and more preferably 1.2 μm or less, however.

As the material of the insulating film of the first wiring structure layer 210, it is possible to suitably use an inorganic insulating material, among other things, with emphasis on the enhancement of manufacturing accuracy and the stability of electrical characteristics in order to cope with fine wiring rules. As a low-dielectric constant material (low-k material) lower in specific permittivity than $SiO_2$, an organic insulating material may be used in some part. Examples of the inorganic insulating material include $SiO_2$, $Si_3N_4$, NSG (non-dope silicate glass), BSG (boron silicate glass), PSG (phosphosilicate glass), and BPSG (boron phosphorous silicate glass).

In order to reduce parasitic capacitance with respect to signal wiring lines, at least one interlayer insulating film 211 or inter-wire insulating film 22, among a plurality of insulating films provided near the semiconductor substrate 201, is desirably formed of a low-k material. Examples of the low-k material include an inorganic insulating film such as a porous silicon oxide film (porous silica film) and porous HSQ (hydrogen silsesquioxane); an organic insulating film such as porous MSQ (methylsilsesquioxane) and an organic polymer; and a fluorine-containing insulating film such as a fluorinated polymer. It is possible to suitably use a low-k material the elastic modulus of which at 25° C. is within the range of 4 to 10 GPa.

Each second insulating layer 221 of the second wiring structure layer 220 is made of an insulating material different from those of the first insulating layers (interlayer insulating layers 211 and inter-wire insulating layers 22) of the first wiring structure layer 210. In addition, the thickness of each second insulating layer 221 is greater than the thickness of each first insulating layer (sum of the thicknesses of interlayer insulating layer 211 and inter-wire insulating layer 22) of the first wiring structure layer. Yet additionally, the thickness of each second wiring line 222 of the second wiring structure layer 220 is greater than the thickness of each first wiring line 21.

Such a second wiring line 222 of the second wiring structure layer 220 can be formed utilizing a wiring technology suitable for a wire size intermediate between the wire sizes of a semiconductor manufacturing process and a printed-wiring substrate manufacturing process, i.e., a wiring technology (wafer-level rewiring technology) referred to as "Superconnect."

The second wiring line 222 can be formed by a subtractive method, a semi-additive method, a full-additive method, or the like. From the viewpoint of coping with finer pitches, a semi-additive method is preferred.

A semi-additive method is a method in which a resist provided with openings created into a desired pattern is formed after a power supply layer is formed by a nonelectrolytic plating method, a sputtering method, a CVD method or the like, metal is deposited within the resist openings by an electrolytic plating method, and the power supply layer is etched after the resist is removed, thereby obtaining a desired wiring pattern.

A subtractive method is a method in which a resist having a desired pattern is formed on copper foil provided on a substrate or an insulating layer, unnecessary portions of the copper foil are etched away, and then the resist is delaminated, thereby obtaining a desired wiring pattern.

A full-additive method is a method in which a resist having a desired pattern is formed after a nonelectrolytic plating catalyst is adsorbed onto a substrate or an insulating layer, the catalyst is activated while leaving over this resist as an insulating film, and metal is deposited in openings of the resist insulating film by a nonelectrolytic plating method, thereby obtaining a desired wiring pattern.

As the material of the second wiring line 222, it is possible to use one or more than one type of metal material selected from the group consisting of copper, silver, gold, nickel, aluminum, titanium, molybdenum, tungsten, and palladium. From the viewpoint of electrical resistance values and cost, copper is particularly desirable. For example, a second wiring line made of 5 μm-thick copper can be formed by a semi-additive method. Alternatively, an adhesion layer made of an electroconductive material (for example, titanium, tungsten, or an alloy thereof) having high adhesiveness to an insulating layer may be formed, and an electroconductive layer made of another electroconductive material (for example, copper or aluminum) may be formed on the adhesion layer, thereby forming a second wiring line having a laminated structure composed of this adhesion layer and this electroconductive layer.

The thickness of each second wiring line 222 is greater than the thickness of each first wiring line 21, and is preferably twice or more greater, and more preferably three times or more greater. Furthermore, each second wiring line 222 can be set to a thickness four times or more greater than the thickness of each first wiring line 21. Since wiring resistance becomes lower with an increase in the thickness of each second wiring line, a plurality of power supply lines and a plurality of ground lines of a semiconductor element can respectively be bundled to reduce the number of terminals. At the same time, the second wiring structure layer 220 enables additional signal lines which used to be difficult to draw out from a semiconductor element to be easily drawn out from the semiconductor element 200 to the outside. If the second wiring line is too thick, it is difficult to form a desired wiring structure satisfactorily connected to a fine (narrow-pitched, in particular) first wiring structure layer, and the thickness of the second wiring structure layer increases significantly. Accordingly, the thickness of each second wiring line is preferably set as appropriate within the range of, for example, 10 times or less the maximum thickness of the first wiring lines, so as not to be too large. In addition, the thickness of each second wiring line is preferably set so as to be less than the minimum thickness of a wiring line of the upper surface-side wiring structure layer (or an upper surface-side wiring line). The thickness of the second wiring line can be set to within the range of, for example, 3 to 12 μm, and is more preferably set to within the range of 5 to 10 μm.

As the material of the second insulating layer, it is possible to suitably use a resin insulating material. For example, a photosensitive or nonphotosensitive organic material can be used. Examples of this resin insulating material include epoxy resin, epoxy acrylate resin, urethane acrylate resin, polyester resin, phenol resin, polyimide resin, BCB (benzocyclobutene), PBO (polybenzoxazole) and polynorbornene resin, though not limited to these. For example, it is possible to form a second insulating layer made of 10 μm-thick polyimide resin. Polyimide resin and PBO, in particular, are superior in mechanical characteristics, including film strength, modulus of elongation, the percentage of elongation at break. Consequently, high reliability can be attained with these materials.

If a photosensitive material is used as the resin insulating material, a via hole can be formed by a photolithographic method. If a nonphotosensitive material or an organic material which is photosensitive but low in pattern resolution is used, a via hole can be formed using a laser, a dry etching method, a blasting method, or the like.

By using a resin material for the second insulating layers, stress arising due to strain between the semiconductor element and the upper surface-side wiring structure layer (or the upper surface-side wiring line) and acting on the semiconductor element can be relieved by means of the deformation of each second insulating layer. Thus, it is possible to effectively reduce stress propagation to the first wiring structure layers. The elastic modulus of the material of each second insulating layer at 25° C. is desirably within the range of, for example, 0.15 to 8 GPa. If the elastic modulus of the insulating material is too low, the amount of deformation of each second insulating layer at the time of tress relaxation is large and most of the stress is applied to the second wiring lines. Consequently, disconnection of a second wiring line or breakage at a second wiring line/via 104 interface is liable to occur. If the elastic modulus of the insulating material is too high, the amount of deformation of each second insulating layer is inadequate, and therefore, stress relaxation by the second wiring structure layer is insufficient. This reduces the effect of suppressing delamination, insulating film disruption, and the like in the first wiring structure layer. Stress can be more effectively relieved in the second wiring structure layer by combining insulating materials, so that the elastic modulus of each second insulating layer is lower than the elastic modulus of the insulating films (first insulating layers) of the first wiring structure layer. Thus, it is possible to enhance the effect of protecting the first wiring structure layer. If an upper surface-side wiring structure layer is provided, it is possible to attain a stress relaxation effect by the second wiring structure layer, while more sufficiently securing electrical connection functions within the second wiring structure layer, by allowing the second wiring structure layer to include an insulating layer, as a second insulating layer, higher in elastic modulus than the insulating layers of the upper surface-side wiring structure layer.

The thickness of each second insulating layer 221 is set so as to be greater than the thickness of each first insulating layer (interlayer insulating layer 211 and inter-wire insulating layer 22), and is preferably twice or more greater, and more preferably three times or more greater. Furthermore, each second insulating layer 221 can be set to a thickness four times or more greater than the thickness of the first insulating layers. It is possible to attain more sufficient coatability and impact resistance and a more sufficient effect of stress relaxation with an increase in the thickness of each second insulating layer. If each second insulating layer is too thick, it is difficult to form a via, and the size thereof in the thickness direction increases. Accordingly, the thickness of each second insulating layer is preferably set as appropriate within the range of, for example, 20 times or less the maximum thickness of the first insulating layers, so as not to be too large. If an upper surface-side wiring structure layer is provided, the thickness of each second insulating layer is preferably set so as to be less than the minimum thickness of the insulating layers of the upper surface-side wiring structure layer. The thickness of at least the uppermost layer-side insulating layer of the second wiring structure layer is preferably 3 μm or greater. The thickness of each second insulating layer can be set to within the range of, for example, 3 to 30 μm, and is preferably within the range of 7 to 20 μm.

Each second insulating layer 221 can be formed using, for example, a transfer molding method, a compression molding method, a printing method, a vacuum pressing method, a vacuum laminating method, a spin coating method, a die coating method, a curtain coating method, or a photolithographic method. For example, polyimide resin can be film-formed by a spin coating method.

If a composite material in which a reinforcing material, such as woven fabric or unwoven fabric, made of glass cloth, aramid fiber or the like is impregnated with resin, or resin containing an inorganic filler or an organic filler, is used as the material of each second insulating layer 221 in the formation of the second wiring structure layer, line-to-line shortcircuiting or the like is more liable to occur as a wiring line becomes finer. Hence, a material not containing a reinforcing material or a filler is preferred as the material of each second insulating layer.

The thickness of a wiring line of the upper surface-side wiring structure layer (or an upper surface-side wiring line) is greater than the thickness of each second wiring line, and is preferably 1.5 times or more greater, and more preferably twice or more greater than the thickness of each second wiring line. Since wiring resistance becomes lower with an increase in the thickness of a wiring line, power supply lines and ground lines drawn out from a semiconductor element can respectively be bundled to reduce the number of external terminals. If the wiring line is too thick, it is difficult to form a desired wiring structure satisfactorily connected to a comparatively fine (comparatively narrow-pitched, in particular) second wiring structure layer, and the thickness of the upper surface-side wiring structure layer increases greatly. Accordingly, the thickness of the wiring line is preferably set as appropriate within the range of, for example, ten times or less the maximum thickness of the second wiring lines, so as not to be too large.

The thickness of an insulating layer of the upper surface-side wiring structure layer is set so as to be greater than the thickness of each second insulating layer, and is preferably 1.5 times or more greater, and more preferably twice or more greater. It is possible to attain more sufficient coatability and impact resistance and a more sufficient effect of stress relaxation with an increase in the thickness of the insulating layers. If the insulating layers are too thick, it is difficult to form a via, and the size thereof in the thickness direction increases. Accordingly, the thickness of the insulating layers is preferably set as appropriate within the range of, for example, 10 times or less the maximum thickness of the second insulating layers, so as not to be too large.

The thickness of an insulating layer of the upper surface-side wiring structure layer can be set to, for example, 20 μm. That is, if the thickness of the second insulating layer is set to 10 μm, the thickness of the insulating layer can be set so as to be twice that thickness.

The wiring substrate of the present exemplary embodiment allows a wiring pitch to be extended stepwise, in the order from the first wiring structure layer 210, through the second wiring structure layer 220, to the upper surface-side wiring structure layer 130. In the second wiring structure layer 220, power supply wiring lines and grounding wiring lines can respectively be integrated. In addition, an upper surface-side wiring structure and terminals can be formed at pitches sufficiently extended with respect to a pitch within the semiconductor element by using a fan-out wiring line drawn out from the second wiring structure layer 220. As a result, it is possible to enhance reliability and form a wiring substrate (semiconductor package) in which a high-density semiconductor element (for example, an LSI chip) is built.

Yet additionally, a resin insulating material not containing a filler can be used as the second insulating layers in the second wiring structure layer 220. Consequently, it is possible to fully cope with a fine wiring pitch of the lower layer-side wiring structure (first wiring structure layer 210) and form a high-reliability wiring structure.

Still additionally, it is possible for the upper surface-side wiring structure layer 130 to use, as an insulating layer thereof, a material lower in curing temperature than the second insulating layers. Consequently, it is possible to realize a reduction in warpage even when a device as a while is thinned.

For example, if polyimide resin not containing a filler is used for each second insulating layer and filler-containing epoxy resin low in curing temperature is used for the insulating layers of the upper surface-side wiring structure layer, process temperature can be made lower and the amount of warpage can be reduced, compared with a case in which epoxy resin is used for the lower layer side and polyimide resin high in curing temperature is used for the upper layer side. Since each second insulating layer does not contain a filler in this case, it is possible to form a second wiring structure layer adapted to the fine wiring structure of the first wiring structure layer. In addition, since the insulating layers of the upper surface-side wiring structure layer contain a filler, it is possible to improve the heat resistance and the mechanical strength of both the upper surface-side wiring structure layer and a device as a whole.

Modified Examples of Third Exemplary Embodiment

Figure 11A:
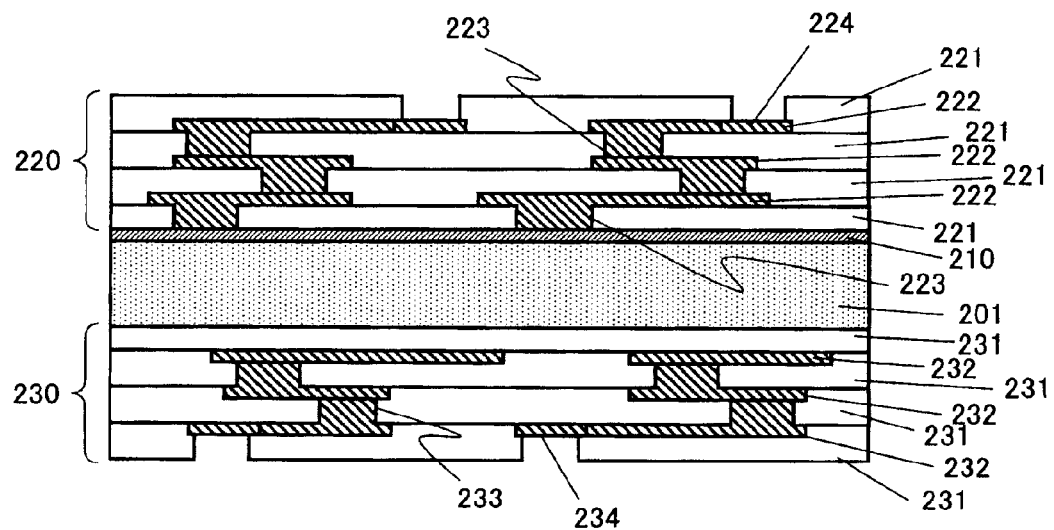
FIG. 11A is a cross-sectional view illustrating a semiconductor element to be mounted on a wiring substrate in accordance with a modified example of the third exemplary embodiment.

As a modified example of the third exemplary embodiment, the present exemplary embodiment may incorporate the semiconductor element illustrated in FIG. 11A in place of the semiconductor element illustrated in FIG. 10A.

The present exemplary embodiment is the same as the third exemplary embodiment, except that a wiring structure layer (hereinafter referred to as "third wiring structure layer") 230 is formed on the rear surface side of the semiconductor substrate 201. Like the second wiring structure layer 220, the third wiring structure layer 230 includes third insulating layers 231, third wiring lines 232, vias 233 and, as necessary, terminals 234. The wiring pattern of the third wiring structure layer 230 need not necessarily be the same as the wiring pattern of the second wiring structure layer 220, and the number of layers of the third wiring structure layer 230 may be set as desired. From the viewpoint of suppressing warpage, however, the two wiring structure layers are preferably the same or close to each other in structure, including the number of laminated wiring line layers, the number of laminated insulating layers, a wiring pattern, and a material. A peripheral insulating layer 103 surrounds the outer circumferential side surface of the third wiring structure layer 230, as well as the outer circumferential side surfaces of the first wiring structure layer 210 and second wiring structure layer 220.

The third wiring structure layer 230 can be provided on a thinly-ground rear surface of the semiconductor substrate 201. A semiconductor element including the third wiring structure layer 230 is fixed onto a base insulating layer 101 (or a supporting substrate to be removed later) by providing a bonding layer 102 on the lower surface of the third wiring structure layer 230. In addition, the area of the rear surface of the semiconductor element can be effectively utilized by electrically connecting the semiconductor element to wiring lines of the lower surface-side wiring structure layer 140 by providing vias penetrating through the bonding layer 102 to improve the rate of containing wiring. It is also possible to further improve heat dissipation performance, noise shielding performance, and the like.

According to such a structure as described above, the impact resistance of the semiconductor element is improved, compared with a single unit of the thinly-ground semiconductor element, since an insulating layer made of highly tough resin is provided on both sides of the semiconductor element. In addition, effects by insulating layers on both sides are cancelled out to enable reduction in warpage. Consequently, process windows, such as pick-up conditions (rate and amount of plunge-up), conditions of suction by a head, and mounting conditions (pressurization and heating) at the time of mounting are widened. These widened process windows not only stabilize manufacturing processes, but also improve suction properties and image recognition properties for reasons of the semiconductor element being planar. Accordingly, it is possible to improve mounting accuracy at the time of mounting the semiconductor element onto the base insulating layer (or the supporting substrate to be removed later). As a result, it is possible to improve the yield thereof in addition to reduce warpage in the wiring substrate.

Figure 11B:
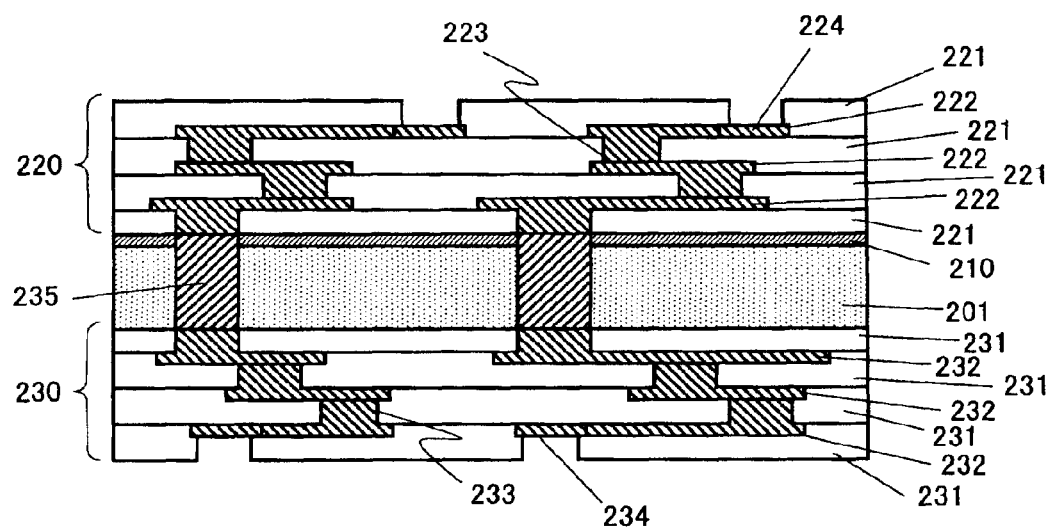
FIG. 11B is a cross-sectional view illustrating a semiconductor element to be mounted on a wiring substrate in accordance with another modified example of the third exemplary embodiment.

In the semiconductor element including the third wiring structure layer provided on the rear surface thereof, a through-via (hereinafter referred to as "intra-element through-substrate via") 235 can be formed in the semiconductor substrate 201, as illustrated in FIG. 11B.

The position, size and quantity of the intra-element through-substrate via 235 can be set optionally. The material of the via may be either an electrical conductor or an insulator. As such an intra-element through-substrate via, a via made of copper is preferred.

According to such a structure as described above, the intra-element through-substrate via can function as a reinforcing, heat-dissipating via. In addition, the impact resistance of the semiconductor element is improved, compared with a single unit of the thinly-ground semiconductor element, since an insulating layer made of highly tough resin is provided on both sides of the semiconductor element. In addition, effects by insulating layers on both sides are cancelled out to enable reduction in warpage. Consequently, process windows, such as pick-up conditions (rate and amount of plunge-up), conditions of suction by a head, and mounting conditions (pressurization and heating) at the time of mounting are widened. These widened process windows not only stabilize manufacturing processes, but also improve suction properties and image recognition properties for reasons of the semiconductor element being planar. Accordingly, it is possible to improve mounting accuracy at the time of mounting the semiconductor element onto the base insulating layer (or the supporting substrate to be removed later). As a result, it is possible to improve the yield thereof in addition to reduce warpage in the wiring substrate.

In addition, by electrically connecting first and third wiring lines through intra-element through-substrate vias 235, it is possible to route signal wiring lines, power supply wiring lines, and grounding wiring lines also on the rear surface side of the semiconductor element. Thus, it becomes possible to build in a more highly-functional semiconductor element.

In the wiring substrates described heretofore, an LCR element serving as a circuit noise filter may be provided within any one of the wiring-structure layers. Preferred as dielectric materials for composing a capacitor are metal oxides, such as titanium oxide, tantalum oxide, $Al_2O_3$, $SiO_2$, $ZrO_2$, $HfO_2$, and $Nb_2O_5$; perovskite-based materials, such as BST (($Ba_x$, $Sr_{1-x}$)$TiO_3$), PZT (Pb ($Zr_x$, $Ti_{1-x}$)$O_3$, and PLZT (($Pb_{1-y}$, $La_y$)($Zr_x$, $Ti_{1-x}$)$O_3$), wherein $0<x<1$, $0<y<1$; and a Bi-based layer-like compound, such as $SrBi_2Ta_2O_9$. In addition, as a dielectric material for composing a capacitor, an organic material mixed with an inorganic material or a magnetic material, or the like may be used.

Furthermore, a wiring substrate in accordance with the exemplary embodiment of the present invention may incorporate a plurality of semiconductor elements. In addition to the semiconductor elements, the wiring substrate may incorporate, as passive components, LCR parts, MEMS parts, sensors, energy devices, optical parts, and the like.

Hereinafter, a description will be given of methods of manufacturing wiring substrates in accordance with the exemplary embodiments of the present invention.

Manufacturing Example 1

First, there is prepared a semiconductor element 200 provided with the above-mentioned terminals.

In the semiconductor element, function elements, such as transistors, and the above-mentioned first wiring structure layer are formed on a semiconductor substrate. If necessary, the above-mentioned second wiring structure layer is formed on this first wiring structure layer. The function elements and the first wiring structure layer can be formed using a usual semiconductor manufacturing process technology, as described earlier. The second wiring structure layer can be formed utilizing a wiring technology (wafer-level rewiring technology) referred to as "Superconnect," as described earlier. A second wiring line can be formed by, for example, a semi-additive method. Either a photosensitive or nonphotosensitive material may be used for a second insulating layer, and the second insulating layer can be formed by a spin coating method, a laminating method, a pressing method or a printing method. An opening for a via can be formed by a photolithographic method, as described earlier, if photosensitive resin is used. If a nonphotosensitive material or a material which is photosensitive but low in pattern resolution is used, the opening can be formed using a laser, a dry etching method, a blasting method, or the like. A via can be formed by filling a conductive material in the opening thus formed. The via can also be formed by the following process. A metal post is previously formed on a position for forming the via by a plating method or a printing method. Then, after the second insulating layer is formed, an upper-layer part thereof is removed by a dry etching method, a CMP method, a grinding method, a lapping method or the like, thereby exposing the metal post. A third wiring structure layer can be formed as necessary, in the same way as the second wiring structure layer, on a surface of the semiconductor substrate on the opposite side of the surface thereof on which the first wiring structure layer is formed.

Using a wafer as the semiconductor substrate, a plurality of element structures adapted to the above-mentioned semiconductor element is formed on this wafer. Thereafter, the element structures are cut by means of dicing, cutting, etching or the like, into individual semiconductor elements.

Figure 6:
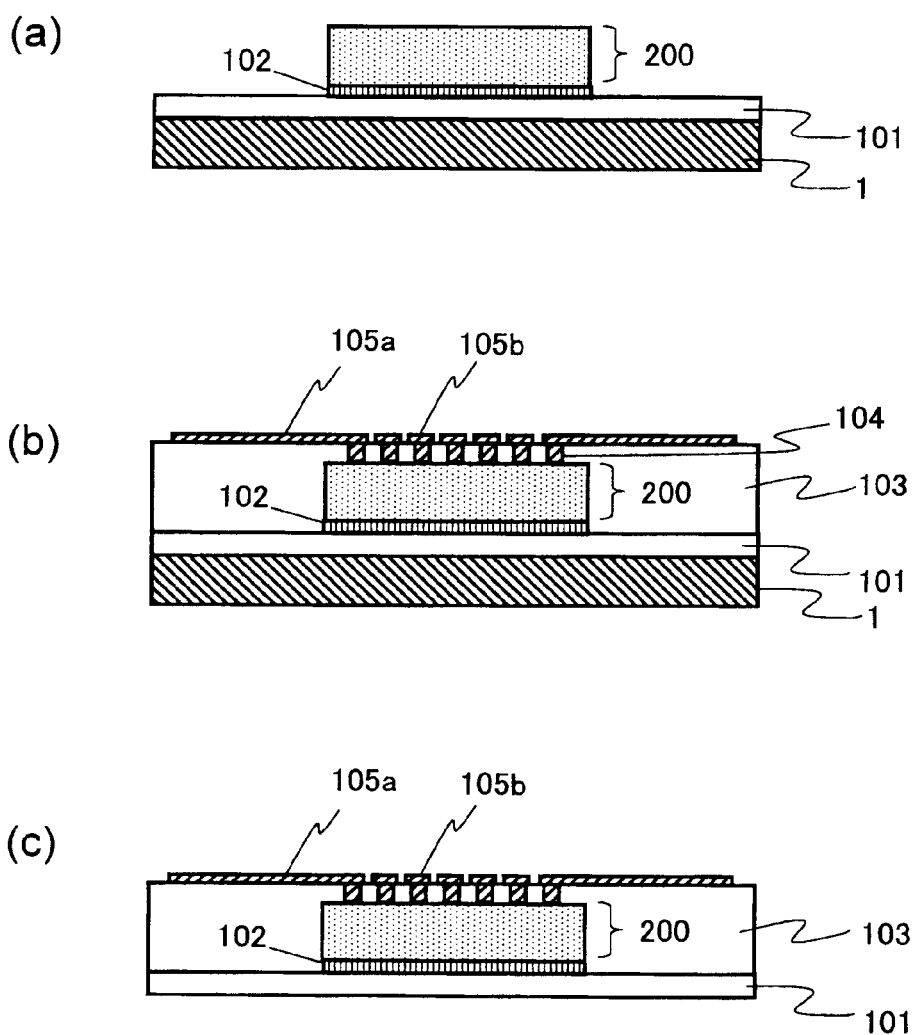
FIG. 6 is a cross-sectional process drawing used to describe a manufacturing example of the wiring substrate in accordance with the first exemplary embodiment of the present invention.

Next, as illustrated in FIG. 6(a), the semiconductor element 200 is fixed onto a base insulating layer 101 on a supporting substrate 1 with a bonding layer 102 therebetween. The semiconductor element may be fixed onto a supporting substrate 1 with the bonding layer therebetween, without providing the base insulating layer. At this time, if the semiconductor element includes a third wiring structure layer, a connecting part made of metal paste or a solder material may be provided as a via for electrically connecting a wiring line of the third wiring structure layer to a wiring line of a lower surface-side wiring structure layer. As the supporting substrate, it is possible to use a substrate made of an inorganic material, a metal material, a resin material or the like. Examples of the substrate material include Si, glass, ceramic, copper, a copper alloy, aluminum, an aluminum alloy, a stainless material, polyimide resin, and epoxy resin.

Next, a resin material is supplied, so as to cover the semiconductor element 200, and is cured to form a peripheral insulating layer 103. A vacuum laminating method or a vacuum pressing method is preferred as a method of supplying the resin material. If a reinforcing material, such as glass cloth or aramid fiber, is contained in the resin material, an opening capable of accommodating the semiconductor element is provided in this resin material. Then, the resin material is supplied so that the semiconductor element is located inside this opening. The opening is covered with another resin material, and then the resin material is vacuum-pressed to fill gaps in the opening and consolidate the resin materials. If the semiconductor element 200 to be built in has a thickness of, for example, 80 μm or greater, a cured resin material having a thickness of, for example, 20 μm or greater may be provided along with an uncured resin material so as to form a layered material, as an insulating material in which an opening for accommodating the semiconductor element is to be provided. By using the cured resin material, it is possible to fully suppress contraction at the time of hardening the uncured resin material and reduce the occurrence of warpage. It does not matter if wiring lines and vias are provided in the cured resin material.

Next, as illustrated in FIG. 6(b), openings are formed in the insulating layer (peripheral insulating layer) immediately above the semiconductor element 200 by a laser or the like, so that terminals of the upper surface of the semiconductor element become exposed. Then, a conductive material is filled in the openings to form vias 104. Subsequently, wiring lines 105a and 105b are formed so as to connect to these vias. An insulating layer for covering the wiring lines may be provided as necessary.

In another method, bumps are previously formed on the terminals on the upper surface of the semiconductor element, and the semiconductor element in which such bumps are formed is fixed to the base insulating layer. Then, a peripheral insulating layer is formed, and portions of the insulating layer (peripheral insulating layer) immediately above the semiconductor element are removed to expose the upper surfaces of the bumps. Consequently, wiring lines can be formed so as to connect to these bumps.

Next, as illustrated in FIG. 6(c), the supporting substrate 1 is removed. The supporting substrate can be removed by means of etching, polishing, delamination or the like, according to the material of the supporting substrate. If a wiring substrate having a single-sided wiring structure in which lower surface-side wiring lines and a lower surface-side wiring structure layer are not provided is formed, the supporting substrate need not be removed and may be left over from the viewpoint of maintaining a stiffening effect. At that time, a supporting substrate not including the base insulating layer 101 may be used, and the above-mentioned wiring structure provided on the base insulating layer may be formed on this supporting substrate. If sufficient strength can be secured by a peripheral insulating layer or the like, the wiring substrate may have a single-sided wiring structure in which the supporting substrate is removed.

Hereafter, an insulating layer 106, a via 107, a wiring line 108, and a protective insulating layer 109 are formed on the upper surface side to complete the upper surface-side wiring structure layer 130. Likewise, a wiring line 143 and a protective insulating layer 144 are formed on the lower surface side to complete the lower surface-side wiring structure layer 140. As a result, there is obtained the wiring substrate illustrated in FIG. 1. If the base insulating layer 101 is not provided on the supporting substrate 1, the base insulating layer 101, the wiring line 143 and the protective insulating layer 144 can be formed in order on the lower surface side to provide the lower surface-side wiring structure layer 140. At that time, the lower surface-side wiring structure layer 140 can also be provided by forming the wiring line 143 and the protective insulating layer 144 without providing the base insulating layer 101.

Although the supporting substrate 1 is used in the present exemplary embodiment, a wiring substrate in which at least part of the lower surface-side wiring structure layer is previously formed may be used in place of the supporting substrate 1. Consequently, it is possible to omit the step of removing the supporting substrate 1 and simplify the manufacturing process.

If the semiconductor element includes a third wiring structure layer, vias can be provided in either the bonding layer 102 or the base insulating layer 101, or in both thereof. By electrically connecting wiring lines of the third wiring structure layer and wiring lines of the lower surface-side wiring structure layer through these vias, it is possible to provide a circuit connected to the wiring lines of the lower surface-side wiring structure layer in the third wiring structure layer. In addition, these vias can be made to function as heat-dissipating paths.

Manufacturing Example 2

First, a semiconductor element 200 is prepared as in Manufacturing Example 1.

Figure 7:
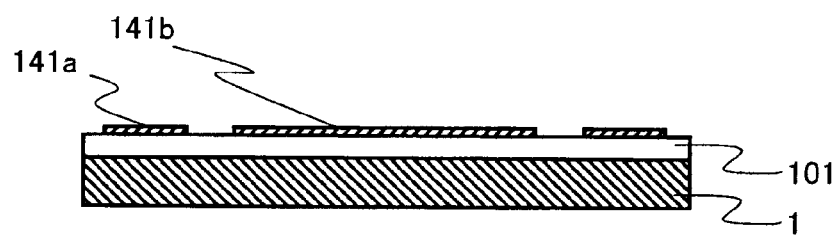
FIG. 7 is a cross-sectional process drawing used to describe a manufacturing example of the wiring substrate in accordance with the second exemplary embodiment of the present invention.
Figure 7:
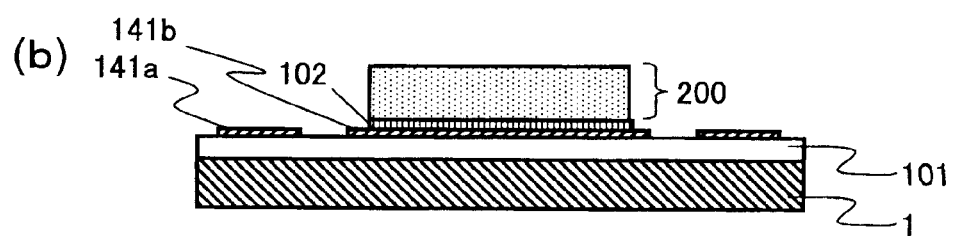
Figure 7:
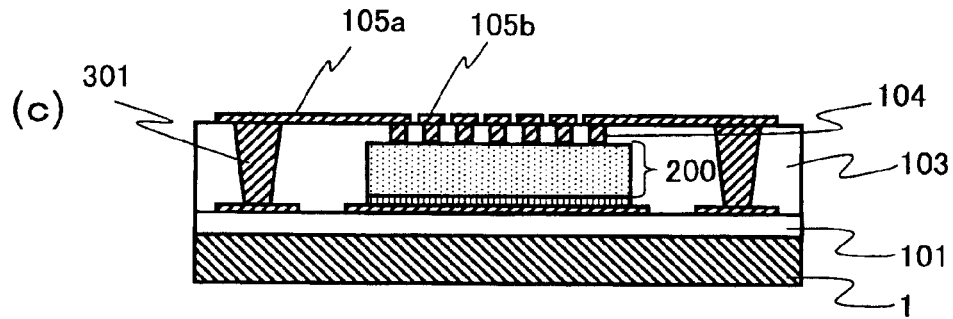
Figure 7:
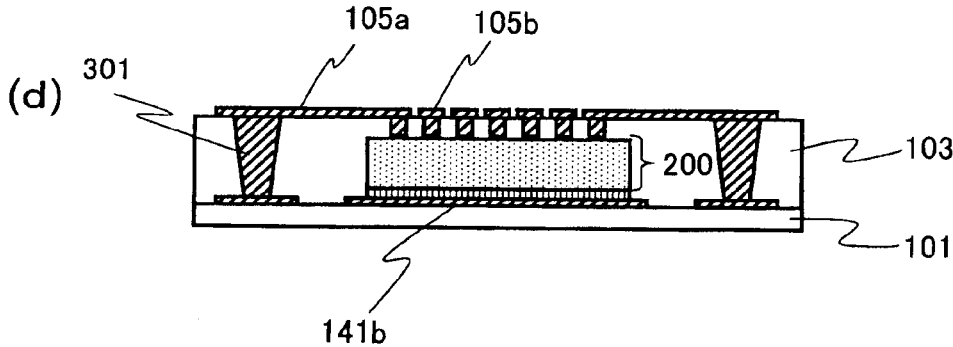

Next, as illustrated in FIG. 7(a), a connecting pad 141a and a circuit pattern 141b are formed on a base insulating layer 101 on a supporting substrate 1. The connecting pad and the circuit pattern can be formed by, for example, a plating method, and may be formed either simultaneously or sequentially. If the removal of the supporting substrate to be executed later is performed by wet etching, the connecting pad and the circuit pattern are formed using a material insoluble to an etching liquid used. The connecting pad and the circuit pattern can be provided as necessary, and a wiring substrate may have a structure in which either one or both of the connecting pad and the circuit pattern are not provided.

Next, as illustrated in FIG. 7(b), the semiconductor element 200 is fixed onto the circuit pattern 141b with a bonding layer 102 therebetween. If the circuit pattern 141b is not provided, the semiconductor element 200 is fixed onto the base insulating layer 101 with the bonding layer 102 therebetween. At this time, if the semiconductor element includes a third wiring structure layer, a connecting part made of metal paste or a solder material may be provided as a via for electrically connecting a wiring line of the third wiring structure layer to a wiring line of a lower surface-side wiring structure layer.

Next, in the same way as in Manufacturing Example 1, a resin material is supplied, so as to cover the semiconductor element 200, and is cured to form a peripheral insulating layer 103.

Next, a hole reaching to the connecting pad 141a is formed in the peripheral insulating layer 103 by a laser method or the like. Resin residues in the hole are removed as necessary by means of desmear or the like. Thereafter, an electroconductive material is filled in the hole by a plating method or a sputtering method to form a lateral-to-element via 301, as illustrated in FIG. 7(c). Then, polishing is performed to planarize a surface of the wiring substrate being fabricated.

Next, in the same way as in Manufacturing Example 1, vias 104 and wiring lines 105a and 105b are formed as illustrated in FIG. 7(c). An insulating layer covering these wiring lines may be provided as necessary.

Next, in the same way as in Manufacturing Example 1, the supporting substrate 1 is removed as illustrated in FIG. 7(d).

Hereafter, an insulating layer 106, a via 107, a wiring line 108, and a protective insulating layer 109 are formed on the upper surface side to complete an upper surface-side wiring structure layer 130. Likewise, a via 142, a wiring line 143 and a protective insulating layer 144 are formed on the lower surface side to complete a lower surface-side wiring structure layer 140. As a result, there is obtained the wiring substrate illustrated in FIG. 2. If the base insulating layer 101, the connecting pad 141a and the circuit pattern 141b are not provided on the supporting substrate 1, the supporting substrate 1 can be removed after forming the lateral-to-element via 301 penetrating through the peripheral insulating layer 103 and reaching to the supporting substrate 1. Thereafter, a connecting pad for connection with the lateral-to-element via 301, an insulating layer 101, a via 142 penetrating through this insulating layer and connecting to this connecting pad, a wiring line 143 for connection with this via, and a protective insulating layer 144 are formed in order on the lower surface side, thereby providing the lower surface-side wiring structure layer 140. At that time, the lower surface-side wiring structure layer 140 can also be provided by forming the wiring line 143 for connection with the lateral-to-element via 301 and the protective insulating layer 144, without forming the connecting pad, the insulating layer 101 and the via 142.

Figure 8:
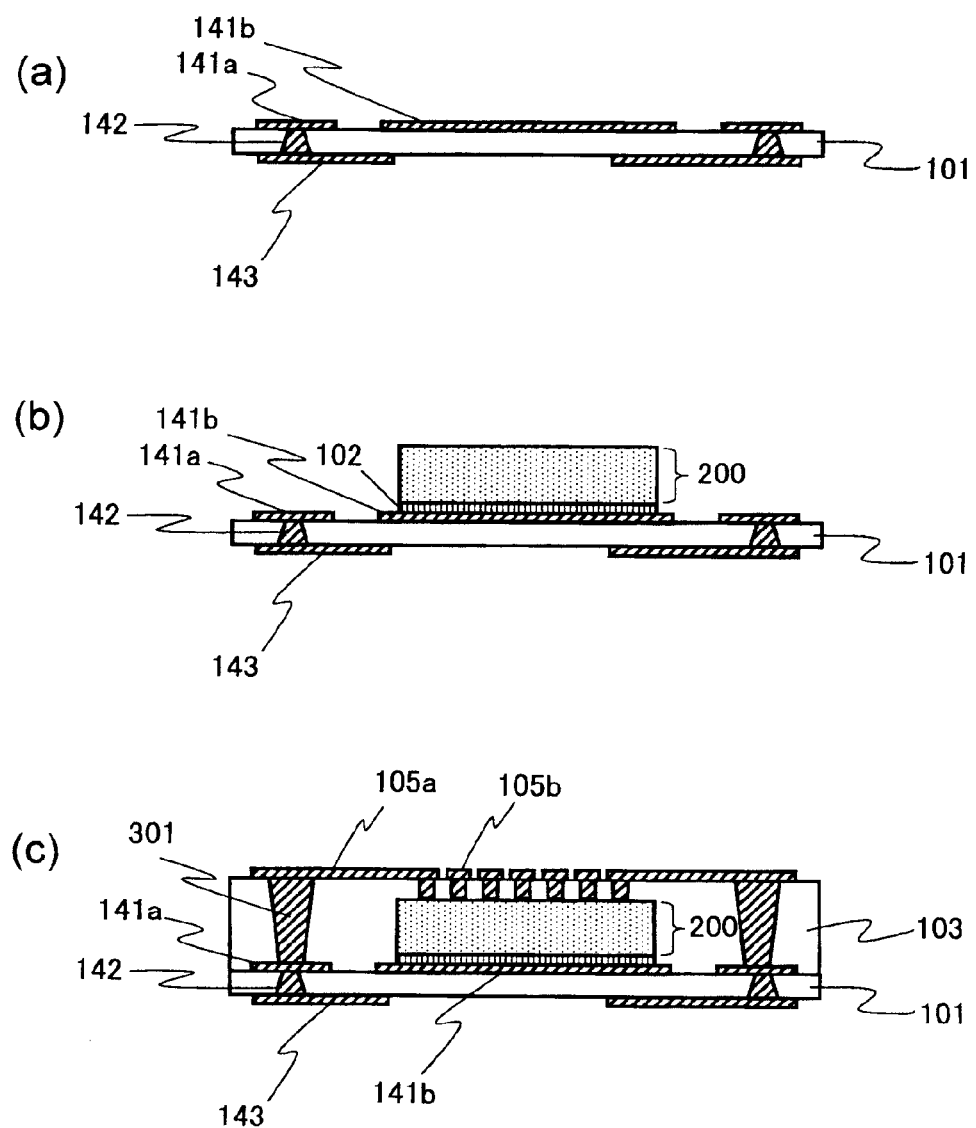
FIG. 8 is a cross-sectional process drawing used to describe another manufacturing example of the wiring substrate in accordance with the second exemplary embodiment of the present invention.

Although the supporting substrate 1 is used in the present exemplary embodiment, a wiring substrate in which at least part of the lower surface-side wiring structure layer is previously formed may be used in place of the supporting substrate 1. Consequently, it is possible to omit the step of removing the supporting substrate 1 and simplify the manufacturing process. For example, as illustrated in FIG. 8(a), there is prepared a wiring substrate including the connecting pads 141a and the circuit pattern 141b which are provided on the upper surface of the base insulating layer 101, the wiring lines 143 provided on the lower surface of this base insulating layer 101, and the vias 142 penetrating through this base insulating layer 101 and each connecting one of the connecting pads 141a to one of the wiring lines 143. Next, as illustrated in FIG. 8(b), the semiconductor element 200 is fixed onto the circuit pattern 141b of this wiring substrate with the bonding layer 102 therebetween. Next, as illustrated in FIG. 8(c), the peripheral insulating layer 103, the lateral-to-element vias 301, the vias 104 on the semiconductor element, and the wiring lines 105a and 105b are formed in the same way as in the above-described manufacturing example. Hereafter, the insulating layer 106, the vias 107, the wiring lines 108, and the protective insulating layer 109 are formed on the upper surface side to complete the upper surface-side wiring structure layer 130. Likewise, the protective insulating layer 144 is formed on the lower surface side to complete the lower surface-side wiring structure layer 140. As a result, there is obtained the wiring substrate illustrated in FIG. 2.

If the semiconductor element includes a third wiring structure layer, vias can be provided in either the bonding layer 102 or the base insulating layer 101, or in both thereof. By electrically connecting wiring lines of the third wiring structure layer to wiring lines of the lower surface-side wiring structure layer through these vias, it is possible to provide a circuit connected to the wiring lines of the lower surface-side wiring structure layer in the third wiring structure layer. In addition, these vias can be made to function as heat-dissipating paths.

While the present invention has been described with reference to the exemplary embodiments, the present invention is not limited to the above exemplary embodiments. Various changes that can be understood by those skilled in the art may be made to the constitution and details of the present invention within the scope thereof.

This application claims the right of priority based on Japanese Patent Application No. 2010-089594, filed on Apr. 8, 2010, the entire content of which is incorporated herein by reference.

REFERENCE SIGNS LIST

1 Supporting substrate
10 Function element
11 Gate electrode
12 Source/drain regions
13 Contact plug
21 First wiring line
22 Inter-wire insulating layer
23 Via
30a Insulating layer
30b Insulating layer
31a Electro conductive layer
31b First conductive part
32 Adhesion layer
33 Second conductive part
101 Base insulating layer
102 Bonding layer
103 Peripheral insulating layer
104 Via
105a Wiring line (fan-out wiring line)
105b Wiring line
106 Insulating layer
107 Via 108 Wiring line
109 Protective insulating layer
130 Upper surface-side wiring structure layer
140 Lower surface-side wiring structure layer
141a Connecting pad
141b Circuit pattern
142 Via
143 Wiring line
144 Protective insulating layer
200 Semiconductor element (LSI chip)
201 Semiconductor substrate
210 First wiring structure layer
211 Interlayer insulating film
212 Wiring line-containing layer
220 Second wiring structure layer
221 Second insulating layer
222 Second wiring line
223 Via
224 Exposed portion of electroconductive layer
230 Third wiring structure layer
231 Third insulating layer
232 Third wiring line
233 Via
234 Terminal
235 Intra-element through-substrate via
301 Lateral-to-element via

The invention claimed is:

1. A wiring substrate in which a semiconductor element is built, the wiring substrate comprising:
   a semiconductor element;
   a peripheral insulating layer covering at least an outer circumferential side surface of the semiconductor element; and
   an upper surface-side wiring line provided on the upper surface side of the wiring substrate,
   wherein the semiconductor element includes, on the upper surface side thereof, an internal terminal electrically connected to the upper surface-side wiring line,
   the internal terminal includes:
      a first conductive part exposed out of an insulating surface layer of the semiconductor element;
      an adhesion layer on the first conductive part; and
      a second conductive part on the adhesion layer, and
   the adhesion layer covers an exposed surface of the first conductive part, and is formed on a portion of the insulating surface layer around the exposed surface of the first conductive part, and the adhesion layer extends around the outer side of an outer edge of the second conductive part so as to surround the second conductive part.

2. The wiring substrate according to claim 1, wherein the first conductive part, the adhesion layer and the second conductive part are respectively made of metal materials, and the insulating surface layer is made of a resin material.

3. The wiring substrate according to claim 1, wherein the adhesion layer is made of a metal material comprising a metal selected from the group consisting of Ti, W, Mo, Cr, V, Ta and Ni.

4. The wiring substrate according to claim 1, wherein the second conductive part is made of a metal material comprising a metal selected from the group consisting of gold, silver, copper, nickel, tin and palladium.

5. The wiring substrate according to claim 1, wherein the second conductive part is made of copper or a copper-based alloy.

6. The wiring substrate according to claim 1, wherein the semiconductor element includes a plurality of the internal terminals and includes adjacent internal terminals sharing an integrally-formed adhesion layer.

7. The wiring substrate according to claim 6, wherein the plurality of the internal terminals includes adjacent power supply terminals sharing the integrally-formed adhesion layer.

8. The wiring substrate according to claim 6, wherein the plurality of the internal terminals includes adjacent ground terminals sharing the integrally-formed adhesion layer.

9. The wiring substrate according to claim 1, wherein the second conductive part is shaped such that the peripheral length of the outer edge of the lower surface of the second conductive part in contact with the adhesion layer is greater than the peripheral length of the outer edge of the upper-surface of the second conductive part and that the peripheral length of the outer edge of a cross section of the second conductive part along the planar direction of the wiring substrate gradually increases in a direction from the upper surface side to the lower surface side thereof.

10. The wiring substrate according to claim 1, wherein the first conductive part is part of a wiring line underneath the insulating surface layer and is a portion of the wiring line exposed out of an opening of the insulating surface layer.

11. The wiring substrate according to claim 1, wherein the first conductive part is a conductive part provided in an opening of the insulating surface layer.

12. The wiring substrate according to claim 1, further comprising a base insulating layer, wherein the semiconductor element and the peripheral insulating layer are provided on the upper surface side of the base insulating layer.

13. The wiring substrate according to claim 1, further comprising a protective insulating film covering the upper surface-side wiring line,
   wherein the protective insulating film includes an opening, and the wiring substrate comprises an external terminal made of a portion of the upper surface-side wiring line exposed in the opening, or an external terminal made of a conductive part provided in the opening.

14. The wiring substrate according to claim 1, further comprising an upper surface-side wiring structure layer including wiring lines and insulating layers alternately provided on the upper surface side of the wiring substrate,
   wherein the uppermost layer-side insulating layer includes an opening, and the wiring substrate comprises an external terminal made of a portion of a wiring line exposed in the opening, or an external terminal made of a conductive part provided in the opening.

15. The wiring substrate according to claim 1, further comprising a lower surface-side wiring line provided on the lower surface side of the wiring substrate.

16. The wiring substrate according to claim 15, further comprising, in the peripheral insulating layer, a lateral-to-element via electrically connected to the upper surface-side wiring line and the lower surface-side wiring line.

17. The wiring substrate according to claim 15, further comprising a protective insulating film covering the lower surface-side wiring line,
   wherein the protective insulating film includes an opening, and the wiring substrate comprises an external terminal made of a portion of the lower surface-side wiring line exposed in the opening, or an external terminal made of a conductive part provided in the opening.

18. The wiring substrate according to claim 15, further comprising a lower surface-side wiring structure layer including wiring lines and insulating layers alternately provided on the lower surface side of the wiring substrate, wherein the lowermost layer-side insulating layer includes an opening, and the wiring substrate comprises an external terminal made of a portion of a wiring line exposed in the opening, or an external terminal made of a conductive part provided in the opening.

19. The wiring substrate according to claim 1, further comprising a supporting substrate provided on the lower surface side of the wiring substrate.

20. The wiring substrate according to claim 1, wherein a noise-shielding circuit pattern is provided on the lower surface of the semiconductor element with an intervention of an insulating adhesive material.

21. The wiring substrate according to claim 1, wherein a potential-stabilizing circuit pattern is provided on the lower surface of the semiconductor element with an intervention of a conductive adhesive material.

* * * * *

UNITED STATES PATENT AND TRADEMARK OFFICE
CERTIFICATE OF CORRECTION

PATENT NO. : 8,710,639 B2  
APPLICATION NO. : 13/639735  
DATED : April 29, 2014  
INVENTOR(S) : Katsumi Kikuchi et al.

Page 1 of 1

It is certified that error appears in the above-identified patent and that said Letters Patent is hereby corrected as shown below:

In the Specification

Column 20, Line 49: Delete "electro conductive" and insert -- electroconductive --

Column 22, Line 34: After "only" insert -- within the trenches. --

Column 32, Line 56: Delete "Electro conductive" and insert -- Electroconductive --

Signed and Sealed this  
Twenty-first Day of October, 2014

Michelle K. Lee  
*Deputy Director of the United States Patent and Trademark Office*